United States Patent
Billingsley et al.

(10) Patent No.: US 9,799,793 B2
(45) Date of Patent: Oct. 24, 2017

(54) SEMICONDUCTOR HETEROSTRUCTURE WITH STRESS MANAGEMENT

(71) Applicant: Sensor Electronic Technology, Inc., Columbia, SC (US)

(72) Inventors: Daniel Billingsley, Round Rock, TX (US); Robert M. Kennedy, Columbia, SC (US); Wenhong Sun, Lexington, SC (US); Rakesh Jain, Columbia, SC (US); Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronics Technology, Inc., Columbia, SC (US)

( * ) Notice: Subject to any disclaimer, the term of this patent is extended or adjusted under 35 U.S.C. 154(b) by 0 days.

(21) Appl. No.: 15/391,948

(22) Filed: Dec. 28, 2016

(65) Prior Publication Data
US 2017/0179335 A1   Jun. 22, 2017

Related U.S. Application Data

(63) Continuation-in-part of application No. 15/265,975, filed on Sep. 15, 2016, which is a continuation of
(Continued)

(51) Int. Cl.
*H01L 29/06* (2006.01)
*H01L 33/00* (2010.01)
(Continued)

(52) U.S. Cl.
CPC .... *H01L 33/0025* (2013.01); *H01L 29/66462* (2013.01); *H01L 29/7787* (2013.01);
(Continued)

(58) Field of Classification Search
CPC ..... H01L 33/12; H01L 33/32; H01L 33/0075; H01L 33/007; H01L 33/20; H01L 33/24
See application file for complete search history.

(56) References Cited

U.S. PATENT DOCUMENTS

| | | |
|---|---|---|
| 2003/0132448 A1 | 7/2003 | Tsujimura et al. |
| 2006/0118820 A1 | 6/2006 | Gaska et al. |

(Continued)

FOREIGN PATENT DOCUMENTS

| | | |
|---|---|---|
| EP | 1990841 A2 | 11/2008 |
| EP | 2037506 A1 | 3/2009 |

OTHER PUBLICATIONS

Acord, J. et al., "In situ measurement of stress generation arising from dislocation inclination in AlxGa1-Xn:Si thin films," Applied Physics Letters, 2008, 4 pages, vol. 93.

(Continued)

*Primary Examiner* — Douglas Menz
(74) *Attorney, Agent, or Firm* — LaBatt, LLC

(57) ABSTRACT

A heterostructure for use in fabricating an optoelectronic device is provided. The heterostructure includes a layer, such as an n-type contact or cladding layer, that includes thin sub-layers inserted therein. The thin sub-layers can be spaced throughout the layer and separated by intervening sub-layers fabricated of the material for the layer. The thin sub-layers can have a distinct composition from the intervening sub-layers, which alters stresses present during growth of the heterostructure.

20 Claims, 15 Drawing Sheets

Related U.S. Application Data application No. 14/686,845, filed on Apr. 15, 2015, now Pat. No. 9,537,054.

(60) Provisional application No. 61/979,717, filed on Apr. 15, 2014.

(51) Int. Cl.

| | | |
|---|---|---|
| *H01L 33/32* | (2010.01) | |
| *H01L 33/12* | (2010.01) | |
| *H01L 29/778* | (2006.01) | |
| *H01L 29/66* | (2006.01) | |
| *H01L 33/20* | (2010.01) | |
| *H01L 33/24* | (2010.01) | |

(52) U.S. Cl.
CPC ........ *H01L 33/007* (2013.01); *H01L 33/0075* (2013.01); *H01L 33/12* (2013.01); *H01L 33/20* (2013.01); *H01L 33/24* (2013.01); *H01L 33/32* (2013.01)

(56) References Cited

U.S. PATENT DOCUMENTS

| | | |
|---|---|---|
| 2010/0314605 A1 | 12/2010 | Khan |
| 2011/0220871 A1 | 9/2011 | Kamikawa et al. |
| 2012/0313076 A1 | 12/2012 | Nakamura et al. |
| 2013/0270519 A1 | 10/2013 | Sun et al. |
| 2015/0221826 A1 | 8/2015 | Yang et al. |

OTHER PUBLICATIONS

Aida, H. et al., "Control of initial bow of sapphire substrates for III-nitride epitaxy by internally focused laser processing," Journal of Crystal Growth, 2012, 7 pages, vol. 361.

Amano, H. et al., "Critical issues in AlxGaN growth," Optical Materials, 2002, 4 pages, vol. 19.

Ambacher, O. et al. "Two dimensional electron gases induced by spontaneous and piezoelectric polarization in undoped and doped AlGaN/GaN heterostructures," Journal of Crystal Growth, 2000, 11 pages, vol. 87, No. 1.

Belousov, M. et al. "In situ metrology advances in MOCVD growth of GaN-based materials," Journal of Crystal Growth, 2004, 6 pages, vol. 272.

Blasing, J. et al. "The origin of stress reduction by low-termperature AlN interlayers," Applied Physics Letter, 2002, 4 pages, vol. 81.

Brunner, F. et al. "Analysis of doping induced wafer bow during GaN:Si growth on sapphire," Journal of Applied Physics, 2012, 6 pages, vol. 112.

Brunner, F. et al. "Growth optimization during III-nitride multiwafer MOVPE using real-time curvature, reflectance and true temperature measurements," Journal of Crystal Growth, 2007, 5 pages, vol. 298.

Brunner, F. et al. "Stress evolution during AlGaN/AlN growth on sapphire," Journal of Crystal Growth, 2013, 5 pages, vol. 376.

Brunner, F. et al. "Quantitative analysis of in situ wafer bowing measurements for III-nitride growth on sapphire," Journal of Crystal Growth, 2008, 7 pages, vol. 310.

Cheng, K. et al., "In situ bow monitoring: towards uniform blue and green InGaN/GaN quantum well structures grown on 100 mm sapphire substrates by MOVPE," Phys. Status Solidi C 7, 2010, 3 pages, No. 7-8, 2082-2084.

Chiang, C.H. et al., "Nonpolar a-plane GaN grown on r-plane sapphire using multilayer AlN buffer by metalorganic chemical vapor deposition," Applied Surface Science, 2011, 4 pages, vol. 257.

Dadgar, A. et al., "MOVPE growth of high-quality AlN," Journal of Crystal Growth, 2006, 5 pages, vol. 297.

Dimitrakopulos, G.P. et al., "Strain accommodation and interfacial structure of AlN interlayers in GaN," 2009, 11 pages, vol. 44, No. 10.

Hiroki, M. et al., "Metalorganic vapor phase epitaxy growth of AlGaN/GaN heterostructures on sapphire substrates," Journal of Crystal Growth, 2002, 5 pages, vol. 237-239.

Jang, Y. et al., "Analysis of the stress distribution in the nonuniformity bent GaN thin film grown on a sapphire substrate," Journal of Applied Physics, 2010, 5 pages, vol. 107, 113537.

Knauer, A. et al., "MOVPE growth for UV-LEDs", Proc. of SPIE, 2014, 9 pages, vol. 7231, 72310G-9.

Krost, A. et al. "In situ monitoring of the stress evolution in growing group-III-nitride layers," Journal of Crystal Growth, 2005, 8 pages, vol. 275.

Liu, W. et al., Influence of the AlN interlayer crystal quality on the strain evolution of GaN layer grown on Si (111), 2007, 4 pages, vol. 90.

Mogilatenko, et al., "Investigation of AlN/(Al,Ga)N superlattices grown on high-temperature AlN layers on sapphire by metalorganic vapour phase epitaxy," Journal of Crystal Growth, 2008, 1 page, vol. 310.

Qin, Z.X., et al., "Study on structure of AlGaN on AlN interlayer by synchrotron radiation XRD and RBS," J Mater Sci 2007, 4 pages.

Raghavan, S. et al., "In situ observation of coalescence-related tensile stresses during metalorganic chemical vapor leposition of GaN on sapphire," Applied Physics Letters, 2005, 3 pages, vol. 86.

Raghavan, S. et al., "Intrinsic stresses in AlN layers grown by metal organic chemical vapor deposition on (0001) sapphire and (111) Si substrates," Journal Applied Physics, 2004, 9 pages, vol. 96.

Shen L. et al. "Morphology and microstructure evolution of AlxGa 1xN epilayers grown on GaN/sapphire templates with AlN interlayers observed by transmission electron microscopy," 2008, 5 pages, vol. 103.

Sun, Q. et al., "High-termperature AlN interlayer for crack-free AlGaN growth on GaN," Journal of Applied Physics, 2008, 5 pages, vol. 104.

Weng, X., et al. "Evolution of threading dislocations in MOCVD-grown GaN films on (1 1 1) Si substrates," Journal of Crystal Growth, 2007, 6 pages, vol. 300.

Zeimer, U. et al. "High quality AlGaN grown on ELO AlN/sapphire templates," Journal of Crystal Growth, 2013, 5 pages, vol. 377.

Zhao, D.G., et al. "Effect of dual buffer layer structure on the epitaxial growth of AlN on sapphire," Journal of Alloys and Compounds, 2012, 5 pages, vol. 544.

Menz, D., U.S. Appl. No. 14/686,845, Notice of Allowance, May 23, 2016, 16 pages.

Menz, D., U.S. Appl. No. 14/686,845, Notice of Allowance, Dec. 30, 2016, 9 pages.

Menz, D., U.S. Appl. No. 15/265,975, Notice of Allowance, Apr. 12, 2017, 20 pages.

Compressive $\sigma_m$     0     Tensile $\sigma_m$

Compressive $\sigma_m$     0     Tensile $\sigma_m$

Region of negative mismatch stress acceptable for thin sub-layers (Lattice constant larger than that of a reference layer)

SEMICONDUCTOR HETEROSTRUCTURE WITH STRESS MANAGEMENT

REFERENCE TO RELATED APPLICATIONS

The current application is a continuation-in-part of U.S. patent application Ser. No. 15/265,975, filed on 15 Sep. 2016, which is a continuation of U.S. patent application Ser. No. 14/686,845, filed on 15 Apr. 2015, which claims the benefit of U.S. Provisional Application No. 61/979,717, filed on 15 Apr. 2014, each of which is hereby incorporated by reference.

TECHNICAL FIELD

The disclosure relates generally to semiconductor structures, and more particularly, to reducing internal stresses and/or wafer bowing during epitaxial growth of semiconductor layers in a semiconductor structure.

BACKGROUND ART

Group III nitride semiconductors are widely used for fabricating efficient blue and ultraviolet light emitting devices (e.g., diodes, lasers, etc.), ultraviolet detectors, and field effect transistors. Due to a wide band-gap, these materials are a leading choice for fabricating deep ultraviolet light emitting diodes (DUV LEDs). In recent years, significant advances have been made in improving the efficiency of DUV LEDs. However, overall efficiencies of these devices remain low. For fabrication of DUV LEDs, achieving a high quality aluminum nitride (AlN) buffer layer as an underlying layer can be important for the subsequent growth of any Al-rich group III nitride semiconductor layers. However, growth of an AlN layer with high crystal quality on substrates formed of sapphire, silicon carbide (SiC) and silicon, which are currently the main substrates for growth of group III nitride devices, is extremely difficult.

For light emitting devices, such as light emitting diodes (LEDs) and especially deep ultraviolet LEDs (DUV LEDs), minimizing a dislocation density and a number of cracks in the semiconductor layers increases the efficiency of the device. In addition, it can lead to increased reliability of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Other approaches rely on epitaxially growing a group III nitride based semiconductor superlattice. A superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., on the order of a few micrometers) are desirable to reduce current crowding. Using a superlattice approach, an AlN/AlGaN superlattice was grown to reduce biaxial tensile strain and a 3.0 μm-thick $Al_{0.2}Ga_{0.8}N$ was achieved on sapphire without any cracks. Such a superlattice can be used to minimize the dislocation density due to varying stresses in the sub-layers of the superlattice elements.

While the superlattice approaches allow some control of tensile and compressive stresses in epitaxially grown nitride semiconductor layers, the approaches do not enable epitaxial growth of nitride based semiconductor layers with uniform composition. Based on previous experience obtained from gallium nitride (GaN) growth, lateral epitaxial overgrowth (LEO) has proven an efficient way for significant reduction of dislocation in GaN films. Several other technologies evolved from LEO, such as pendeo-epitaxial, cantilever epitaxy, and facet controlled LEO, have also been developed. While the above approaches work well for epitaxial growth of GaN semiconductor layers, epitaxial growth of aluminum nitride (AlN) layers is more challenging due to a relatively small lateral growth of AlN films.

Another leading approach includes growth of AlN films over patterned substrates, such as, for example, a patterned sapphire substrate (PSS). While the PSS-based approach generally produces an AlN layer with reduced stress and low dislocation densities, the patterning process and subsequent growth of AlN films is technologically complicated and costly.

SUMMARY OF THE INVENTION

Aspects of the invention provide a heterostructure for use in fabricating an optoelectronic device. The heterostructure includes a layer, such as an n-type contact or cladding layer, that includes thin sub-layers inserted therein. The thin sub-layers can be spaced throughout the layer and separated by intervening sub-layers fabricated of the material for the layer. The thin sub-layers can have a distinct composition from the intervening sub-layers, which alters stresses present during growth of the heterostructure. The layer can be configured to control stresses present during growth of the heterostructure. To this extent, the thin sub-layers can be configured to reduce internal stresses, wafer bowing, and/or the like.

A first aspect of the invention provides a heterostructure comprising: a substrate; and a group III nitride layer epitaxially grown on the substrate, wherein the group III nitride layer includes: a plurality of sub-layers of a first group III nitride material and having a first thickness; and a plurality of thin sub-layers of a second group III nitride material and having a second thickness, wherein the plurality of sub-layers alternate with the plurality of thin sub-layers, wherein the first group III nitride material includes a molar fraction of gallium of at least 0.05, wherein a molar fraction of gallium in the first group III nitride material differs from the molar fraction of gallium in the second group III nitride material by at least 0.05, and wherein the second thickness is at most five percent of the first thickness.

A second aspect of the invention provides an optoelectronic device comprising: a substrate; and an n-type layer formed of group III nitride materials, wherein the n-type layer includes: a plurality of sub-layers of a first group III nitride material and having a first thickness; and a plurality of thin sub-layers of a second group III nitride material and having a second thickness, wherein the plurality of sub-layers alternate with the plurality of thin sub-layers, wherein the first group III nitride material includes a molar fraction of gallium of at least 0.05, wherein a molar fraction of gallium in the first group III nitride material differs from the molar fraction of gallium in the second group III nitride material by at least 0.05, and wherein the second thickness is at most five percent of the first thickness.

A third aspect of the invention provides a method of fabricating a device, the method comprising: epitaxially growing a group III nitride layer on a substrate, wherein the group III nitride layer includes: a plurality of sub-layers of a first group III nitride material and having a first thickness; and a plurality of thin sub-layers of a second group III nitride material and having a second thickness, wherein the plurality of sub-layers alternate with the plurality of thin sub-layers, wherein the first group III nitride material includes a molar fraction of gallium of at least 0.05, wherein a molar fraction of gallium in the first group III nitride material differs from the molar fraction of gallium in the second group III nitride material by at least 0.05, and wherein the second thickness is at most five percent of the first thickness.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a heterostructure for use in fabricating an optoelectronic device. The heterostructure includes a layer, such as an n-type contact or cladding layer, that includes thin sub-layers inserted therein. The thin sub-layers can be spaced throughout the layer and separated by intervening sub-layers fabricated of the material for the layer. The thin sub-layers can have a distinct composition from the intervening sub-layers, which alters stresses present during growth of the heterostructure. The layer can be configured to control stresses present during growth of the heterostructure. To this extent, the thin sub-layers can be configured to reduce internal stresses and/or wafer bowing. As used herein, unless otherwise noted, the term "set" means one or more (i.e., at least one) and the phrase "any solution" means any now known or later developed solution.

The present technique may be combined with the technique of growth of a buffer layer as described in U.S. Provisional Patent Application No. 61/943,365, filed on 22 Feb. 2014, and U.S. Utility patent application Ser. No. 14/628,281, filed on 22 Feb. 2015, both of which are hereby incorporated by reference.

Figure 1:
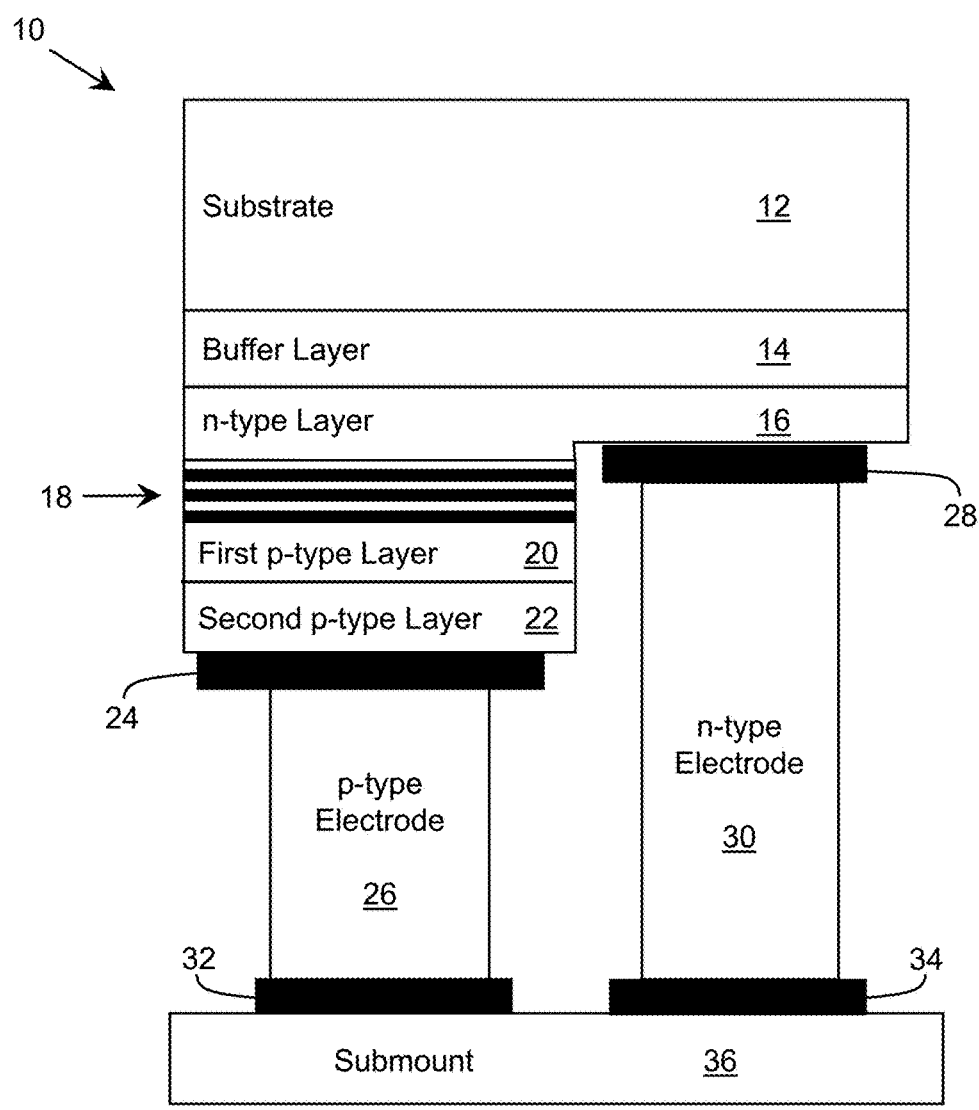
FIG. 1 shows a schematic structure of an illustrative optoelectronic device according to an embodiment.

Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED) or a laser diode (LD). In either case, during operation of the optoelectronic device 10, application of a bias comparable to the band gap results in the emission of electromagnetic radiation from an active region 18 of the optoelectronic device 10. The electromagnetic radiation emitted (or sensed) by the optoelectronic device 10 can have a peak wavelength within any range of wavelengths, including visible light, ultraviolet radiation, deep ultraviolet radiation, infrared light, and/or the like. In an embodiment, the device 10 is configured to emit (or sense) radiation having a dominant wavelength within the ultraviolet range of wavelengths. In a more specific embodiment, the dominant wavelength is within a range of wavelengths between approximately 210 and approximately 360 nanometers. In a still more specific embodiment, the dominant wavelength is approximately 280 nanometers.

The optoelectronic device 10 includes a heterostructure 11 comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 having an n-type side adjacent to the n-type layer 16. Furthermore, the heterostructure 11 of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, the n-type layer 16, the first p-type layer 20, and the second p-type layer 22 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, 20, and 22. When the optoelectronic device 10 is configured to be operated in a flip chip configuration, such as shown in FIG. 1, the substrate 12 and buffer layer 14 should be transparent to the target electromagnetic radiation. To this extent, an embodiment of the substrate 12 is formed of sapphire, and the buffer layer 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_x N_y$), $MgAl_2 O_4$, GaAs, Ge, or another suitable material. Furthermore, a surface of the substrate 12 can be substantially flat or patterned using any solution.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type layer 16, and an n-type electrode 30 can be attached to the n-type contact 28. The p-type contact 24 and the n-type contact 28 can form ohmic contacts to the corresponding layers 22, 16, respectively.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like, which can provide improved heat management during operation of the optoelectronic device 10.

It is understood that the particular configuration and arrangement of layers shown for the optoelectronic device 10 are only illustrative of various configurations and arrangements that are possible under embodiments of the invention. For example, a device heterostructure can include one or more additional layers located between the substrate 12 and the n-type contact layer 16. Similarly, a device heterostructure can include one or more additional layers, each of which is designed to provide a particular function relating to the overall operation of the device (e.g., wave guiding, radiation extraction, electron/hole blocking, breakdown prevention, and/or the like).

In general, growth of the n-type contact layer 16 followed by growth of additional layers, such as the active region 18 and the p-type layer(s) 20, 22, leads to concave bowing of the heterostructure during growth. The concave bowing changes to convex bowing during cool down (after growth) due to a difference in thermal expansion coefficient between the epitaxially grown layers and the substrate 12. For example, the thermal expansion coefficient of the substrate 12 may be larger than that of the epitaxially grown semiconductor layers. In a more particular example, for growing group III nitride semiconductor layers on a sapphire substrate 12, the thermal expansion coefficient of sapphire is about $8 \times 10^{-6}$, whereas the thermal expansion coefficient of the epitaxially grown layers can be half as much as the thermal expansion coefficient of the sapphire substrate 12.

The inventors propose to modify prior art heterostructures to provide an improved stress configuration in the heterostructure at room temperature. To achieve a desirable stress configuration at room temperature, concave bowing is preferred during the growth, where the concave bowing is a result of tensile stresses present during the growth. During the cool down, the substrate 12 undergoes a large thermal contraction resulting in additional compressive stresses within the semiconductor layers. The inventors propose to obtain a more optimal stress configuration by providing more balanced tensile and compressive stresses during growth and cool down. Unfortunately, it is not readily feasible to produce a heterostructure exhibiting no stresses. In particular, compressive stresses in the film generated during cool down are typically larger than tensile stresses generated during growth. As a result, at room temperature, the substrate 12 is typically convex.

For generation of reliable devices 10 and for subsequent processing of the wafer, an amount of convex bowing of the wafer at room temperature can be kept as small as possible. This goal often results in growing epitaxial layers having large tensile stresses and concave bowing during growth. Unfortunately, growing thick layers having tensile stresses can result in either cracking or relaxation through the propagation of dislocations within the layers. Once the tensile stresses are relaxed, they cannot counterbalance subsequent compressive stresses during the cool down.

In addition to controlling stresses in the semiconductor layers, reliability of a group III nitride-based light emitting device 10 depends on the number of dislocations present in the layers, and more specifically in the active region 18 of the device 10. Typically, for thick layers, the dislocation density is substantially reduced due to layer relaxation through dislocation annihilation and bending. Unfortunately, thick semiconductor layers lead to increased stresses, which if not kept under control may relax through generation and/or propagation of dislocations into the active region 18.

Figure 2A:
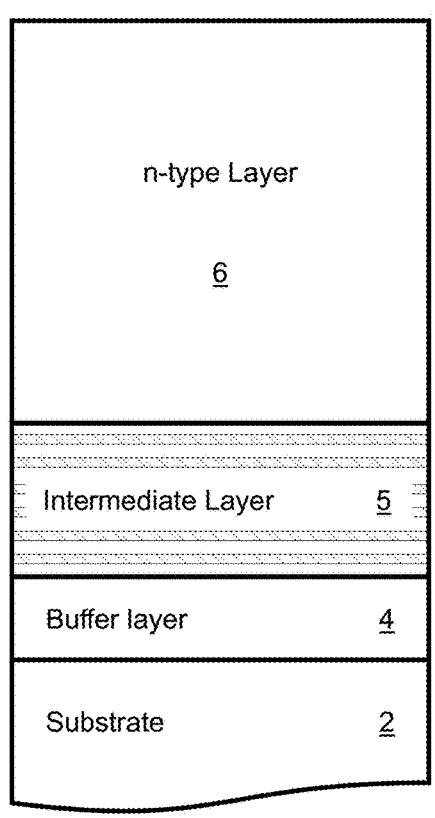
FIGS. 2A and 2B-2C show illustrative heterostructures for use in fabricating an optoelectronic device according to the prior art and embodiments, respectively.
Figure 2B:
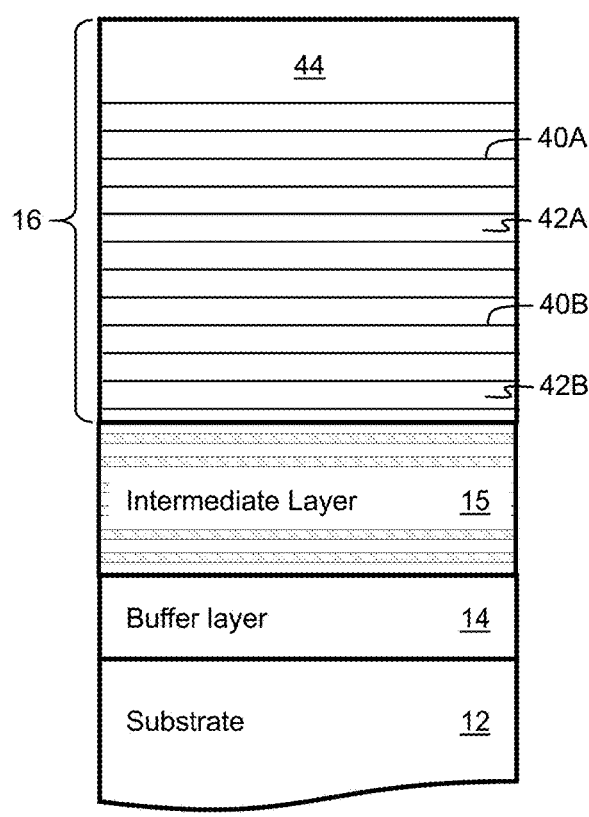

FIGS. 2A and 2B show illustrative heterostructures 1, 11, respectively, for use in fabricating an optoelectronic device according to the prior art and an embodiment, respectively. As shown in FIG. 2A, a prior art heterostructure 1 can include a substrate 2 on which a buffer layer 4 (e.g., a nucleation layer) is epitaxially grown. An intermediate layer 5 can be grown on the buffer layer 4, which can be followed by growth of an n-type contact layer 6. For fabricating a group III nitride-based device, the buffer layer 4 can be formed of aluminum nitride, the intermediate layer 5 can be a superlattice structure including pairs of $Al_xGa_{1-x}N/Al_yGa_{1-y}N$ layers, and the n-type contact layer 6 can be formed of doped aluminum gallium nitride.

In general, the n-type contact layer 6 can be an $Al_xGa_{1-x}N$ layer, in which the amount of aluminum (the x value) can be tailored depending on the design of the active region to be formed thereon. For example, for an active region designated to radiate at a peak wavelength of about 280 nm, the n-type contact layer 6 can have x within a range of 0.35-0.65, and typically has value of about 0.5. The n-type contact layer 6 is typically one of the thickest layers in the heterostructure 1. This layer 6 can have a large impact on the performance and the reliability of the corresponding device.

The inventors propose to control stress in an n-type contact layer by inserting thin sub-layers of a different composition in the n-type contact layer. While aspects of the invention are described with reference to an n-type contact layer, it is understood that embodiments can be directed to various types of layers including, for example, other n-type layers such as an n-type cladding layer, an electron supply layer, a buffer layer 14, and/or the like. Furthermore, an embodiment of the invention provides an intermediate layer 15 including thin sub-layers configured as described herein.

Regardless, FIG. 2B shows a heterostructure 11 according to an embodiment. As illustrated, the heterostructure 11 includes a substrate 12, a buffer layer 14, an intermediate layer 15 (shown as a superlattice structure), and an n-type contact layer 16. The n-type contact layer 16 includes a plurality of thin sub-layers, such as the thin sub-layers 40A, 40B, which are inserted in the n-type contact layer 16 and separated by intervening sub-layers, such as the intervening sub-layers 42A, 42B, which are formed of the n-type contact layer 16 material. In this case, a total number of the thin sub-layers 40A, 40B, a frequency of insertion of the thin sub-layers 40A, 40B (e.g., as characterized by the relative thicknesses of the n-type contact layer 16 and the intervening sub-layers 42A, 42B), as well as a thickness of the inserted sub-layers 40A, 40B can be adjusted to control an amount of stress in the n-type contact layer 16. An active region 18 (FIG. 1), can be grown on the n-type contact layer 16, and can comprise, for example, a series of quantum wells and barriers, which are configured to emit radiation of a target peak wavelength during operation of the corresponding device.

In an embodiment, the heterostructure 11 is a group III nitride-based heterostructure. In this case, the n-type contact layer 16, and therefore the intervening sub-layers 42A, 42B, can be formed of a group III nitride material including gallium. For example, the group III nitride material of the intervening sub-layers 42A, 42B can be $Al_xIn_yB_zGa_{1-x-y-z}N$, where 0≤x, y, z<1 and 1−x−y−z≥0.05. In a more particular embodiment, the group III nitride material of the intervening sub-layers 42A, 42B is AlGaN. In a still more particular embodiment, the group III nitride material of the intervening sub-layers 42A, 42B is $Al_xGa_{1-x}N$ with 0.4<x<0.7. The intervening sub-layers 42A, 42B also can be doped with an n-type dopant. In an embodiment, the intervening sub-layers 42A, 42B have an n-type dopant concentration of at least $5 \times 10^{17}$ dopant atoms per cubic centimeter.

The thin sub-layers 40A, 40B can be formed of a group III nitride material including less gallium than that included in the intervening sub-layers 42A, 42B. In an embodiment, the thin sub-layers 40A, 40B are formed of a group III nitride material in which the gallium molar fraction is at least 0.05 lower than the gallium molar fraction in the intervening sub-layers 42A, 42B. In a more particular embodiment, the group III nitride material of the thin sub-layers 40A, 40B is $Al_yGa_{1-y}N$, where 0<y≤1. In a still more particular embodiment, the thin sub-layers 40A, 40B are formed of aluminum nitride. In a particular embodiment, a thin sub-layer 40A, 40B can comprise a monolayer.

The thin sub-layers 40A, 40B have a thickness significantly less than the thickness of the intervening sub-layers 42A, 42B. In an embodiment, each intervening sub-layer 42A, 42B has a thickness of at least twenty nanometers. In a more particular embodiment, each intervening sub-layer 42A, 42B has a thickness of between approximately 20 nanometers and approximately 500 nanometers. In an embodiment, the thin sub-layers 40A, 40B have a thickness that is at most five percent a thickness of the intervening sub-layers 42A, 42B. In a more particular embodiment, the thin sub-layers 40A, 40B have a thickness that is at most two percent a thickness of the intervening sub-layers 42A, 42B. In an embodiment, a thickness of each of the thin sub-layers 40A, 40B is in a range between approximately 0.2 nanometers and approximately 2 nanometers. In a more particular embodiment, a thickness of each of the thin sub-layers 40A, 40B is in a range between approximately 0.2 nanometers and approximately 1 nanometer. In a still more particular embodiment, a thickness of each of the thin sub-layers 40A, 40B is in a range between approximately 0.2 nanometers and approximately 0.6 nanometers. In an embodiment, the thin sub-layers 40A, 40B can be configured to have a thickness on the order of or less than a tunneling length of carriers in the n-type layer 16.

An illustrative configuration of the n-type layer 16 includes intervening sub-layers 42A, 42B, each formed of $Al_xGa_{1-x}N$, with 0.4<x<0.7 and having a thickness in the range of 20-500 nm and thin sub-layers 40A, 40B, each of which is formed of AlN and has a thickness in a range of 0.2-2 nm. Considering a heterostructure 11 used to fabricate an optoelectronic device 10 (FIG. 1) configured to operate at a peak wavelength of approximately 280 nanometers as a more particular example, the intervening sub-layers 42A, 42B can be formed of $Al_{0.5}Ga_{0.5}N$ and the thin sub-layers 40A, 40B can be formed of AlN. However, it is understood that the molar fraction of aluminum can be in a range of 0.35 to 0.65. Depending on the peak wavelength for the optoelectronic device 10, the composition of the intervening sub-layers 42A, 42B can vary. For example, the composition of the intervening sub-layers 42A, 42B, or at least the intervening sub-layer closest to the active region 18 (FIG. 1), can be selected to be within twenty percent of the composition of the barriers of the active region 18 (or at least the barrier closest to the n-type contact layer 16), which will generally change depending on the peak wavelength of radiation emitted by the active region 18. To this extent, a spacing between the thin sub-layers 40A, 40B (e.g., a thickness of the intervening sub-layers 42A, 42B) can be adjusted based on the operating wavelength of the device 10 (FIG. 1). For example, for an optoelectronic device 10 including an n-type contact layer 16 having intervening sub-layers 42A, 42B formed of $Al_{0.3}Ga_{0.7}N$, the intervening sub-layers 42A, 42B can have thicknesses of approximately 25 nanometers. However, for an optoelectronic device 10 including an n-type contact layer 16 having intervening sub-layers 42A, 42B formed of $Al_xGa_{1-x}N$, with $0.5 \le x \le 0.6$, the intervening sub-layers 42A, 42B can have thicknesses of approximately 50 nanometers.

More generally, thicknesses of the intervening sub-layers 42A, 42B can vary approximately linearly based on the molar fraction of aluminum. For example, for a molar fraction of aluminum of about 0.3, the thicknesses of the intervening sub-layers 42A, 42B can be about 30 nanometers, whereas for a molar fraction of aluminum of about 0.6, the thicknesses of the intervening sub-layers 42A, 42B can be about 60 nanometers. However, it is understood that the various thicknesses and molar fractions can vary by as much as fifty percent from the values stated.

While the n-type contact layer 16 is primarily described as being formed of AlGaN intervening sub-layers 42A, 42B, it is understood that the n-type contact layer 16 can be another type of group III nitride material. For example, the n-type contact layer 16 can include, for example, indium and/or boron, a different molar fraction of aluminum, and/or the like, which can be selected depending on the functionality of the device 10. Furthermore, such a device is only illustrative of various types of optoelectronic devices 10, including optoelectronic devices 10 configured to operate at different peak wavelengths. In an alternative embodiment, a device can comprise an electronic device, such as a high electron mobility transistor. In this case, a thick GaN-based carrier electronic layer can include the inserted thin sub-layers 40A, 40B as described herein in conjunction with the n-type contact layer 16.

Figure 2C:
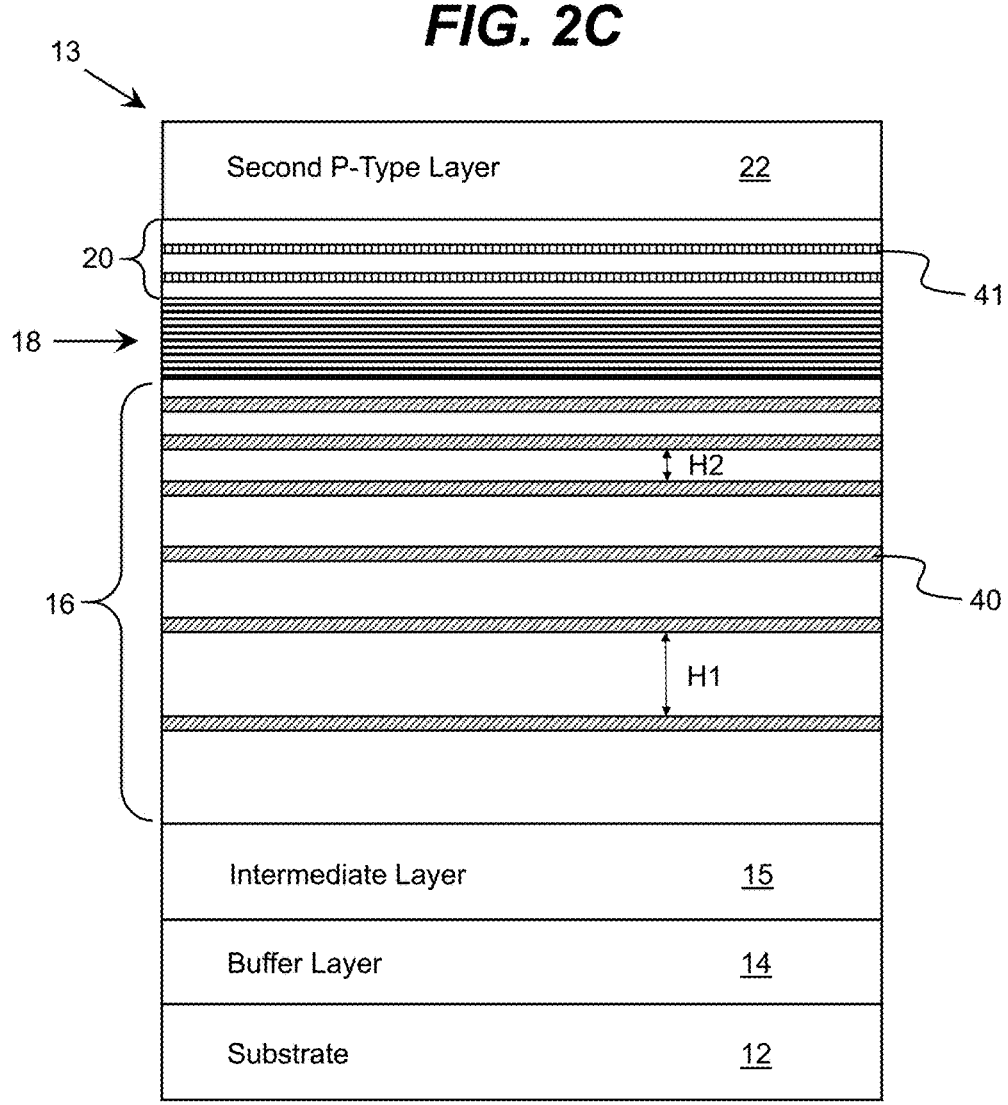

Embodiments of a heterostructure described herein can include thin sub-layers having different configurations and/or in different layers of the heterostructure. To this extent, FIG. 2C shows an illustrative heterostructure 13 including interlayers 40, 41 in two of the semiconductor layers according to an embodiment. As illustrated, the heterostructure 13 includes a substrate 12, a buffer layer 14, and an intermediate layer 15, each of which can be formed as described herein. Additionally, a n-type contact layer 16 can be formed on the intermediate layer 15, followed by an active region 18, a first p-type layer 20, and a second p-type layer 22.

Growth of the n-type contact layer 16 and/or the first p-type layer 20 (e.g., an electron blocking layer) can include formation of one or more thin sub-layers 40, 41 therein. Each thin sub-layer 40, 41 can be configured as described herein. In general, the thin sub-layers 40, 41 can be incorporated into semiconductor layers that require stress management. For instance, the n-type contact layer 16 (e.g., a cladding layer) might include high tensile stresses during epitaxial growth of the layer 16. In this case, incorporation of one or more interlayers 40 of aluminum nitride composition or having a high aluminum nitride molar fraction (e.g., at least 10% higher than the aluminum nitride molar fraction of the layer 16) can result in an overall stress management (e.g., reduction) of the tensile stresses in the n-type contact layer 16. Similarly, the first p-type layer 20 can comprise an electron blocking layer, which is typically under high tensile stress. As a result, one or more gallium nitride thin sub-layers 41 can be formed therein.

In general, the thin sub-layers 40, 41 can be incorporated at a frequency and location within the corresponding semiconductor layer 16, 20 where stress control is needed. In an embodiment, a density or frequency of the thin sub-layers can be a variable function based on a value of the stress within the underlying layer. In an embodiment, an amount of wafer bowing (wafer curvature), which is indicative of tensile stress, is measured during the epitaxial growth of a corresponding layer including thin sub-layers, and a thin sub-layer is introduced once the wafer bowing exceeds a predetermined amount. During the epitaxial growth, the curvature can be measured using a laser measurement system known in art. If curvature exceeds a certain threshold value (with concave curvature being positive) a thin sub-layer can be inserted in the epitaxial structure. It is understood that thin sub-layers can be inserted even when the curvature is convex, if an appropriate target value of the curvature is utilized. A target amount of curvature of the entire wafer can be measured as a displacement of the center of the wafer. In an embodiment, the total curvature can be in a range between 10-200 microns, forming a convex curvature, measured after cooling the semiconductor layers to room temperature.

As illustrated in FIG. 2C, the n-type contact layer 16 can have thin sub-layers 40 that are spaced non-uniformly. For example, for the n-type contact layer 16, the thin sub-layers 40 can be incorporated with a higher frequency in proximity to a boundary between n-type contact layer 16 and the active region 18. To this extent, as illustrated, the distance between adjacent thin sub-layers located further from the active region 18 is H1, whereas the distance between adjacent thin sub-layers located closer to the active region 18 is H2. In this case, H1>H2, which means that the thin sub-layers 40 are inserted more frequently (have a higher density) within the n-type contact layer 16 closer to the active region 18. The frequency of insertion of the thin sub-layers can be adjusted to yield an optimal control of the stresses present within the n-type contact layer 16. Control of the tensile stresses within the n-type contact layer 16 can increase reliability of the resulting device, with tensile stresses resulting in concave wafer curvature.

As FIG. 2C shows, the frequency of the thin sub-layers can increase towards the portion of the n-type contact layer 16 closer to the active region 18 to reduce the tensile stresses, or to increase compressive stresses, in the n-type contact layer 16. In an embodiment, a frequency of the thin sub-layers is selected to result in a uniform stress distribution within the corresponding semiconductor layer. In this case, uniform stress distribution means that the maximum stress variation is within 100 percent of a mean stress value. It is understood that in order to achieve appropriate stress control, the thin sub-layers can have a substantially different composition from the underlying semiconductor layer into which they are inserted. For example, as an illustrative embodiment, AlN interlayers can be inserted in an $Al_{0.5}Ga_{0.5}N$ semiconductor layer leading to about a 1% lattice mismatch resulting in compressive stresses within the $Al_{0.5}Ga_{0.5}N$ layer. In general, a similar lattice mismatch can be utilized to provide effective control of the underlying semiconductor layer with thin sub-layers. In an embodiment, a more conservative measure results in a lattice mismatch of at least 0.5%.

In an embodiment, the thin sub-layers 40 can be incorporated in only a half of the n-type contact layer 16 that is closest to the active region 18. Regardless, it is understood that the frequency of the thin sub-layers 40, 41 can be selected to reduce tensile stresses presented in the corresponding semiconductor layer 16, 20. In an embodiment, inclusion of the thin sub-layers 40, 41 within the semiconductor layer 16, 20 results in an average stress within the semiconductor layer 16 being compressive or no more than 0.2 GPa tensile stress. While the heterostructure 13 is shown including a particular number of thin sub-layers in specific layers, it is understood that this is only illustrative and embodiments of heterostructures described herein can include any number of layers in any location within the heterostructure 13 including any number of thin sub-layers.

Figure 12A:
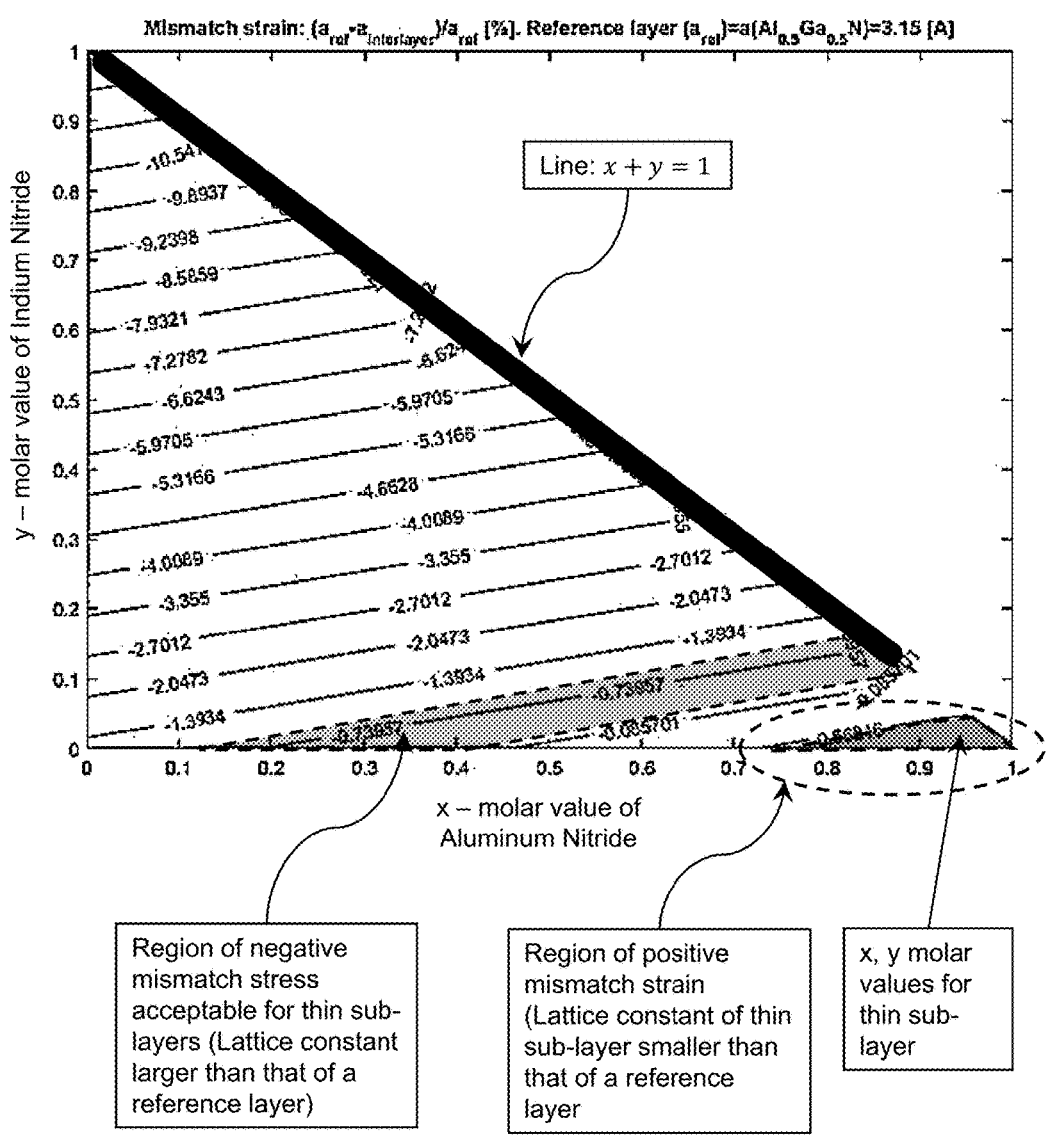
FIGS. 12A and 12B illustrate the mismatch strain for various compositions.
Figure 12B:
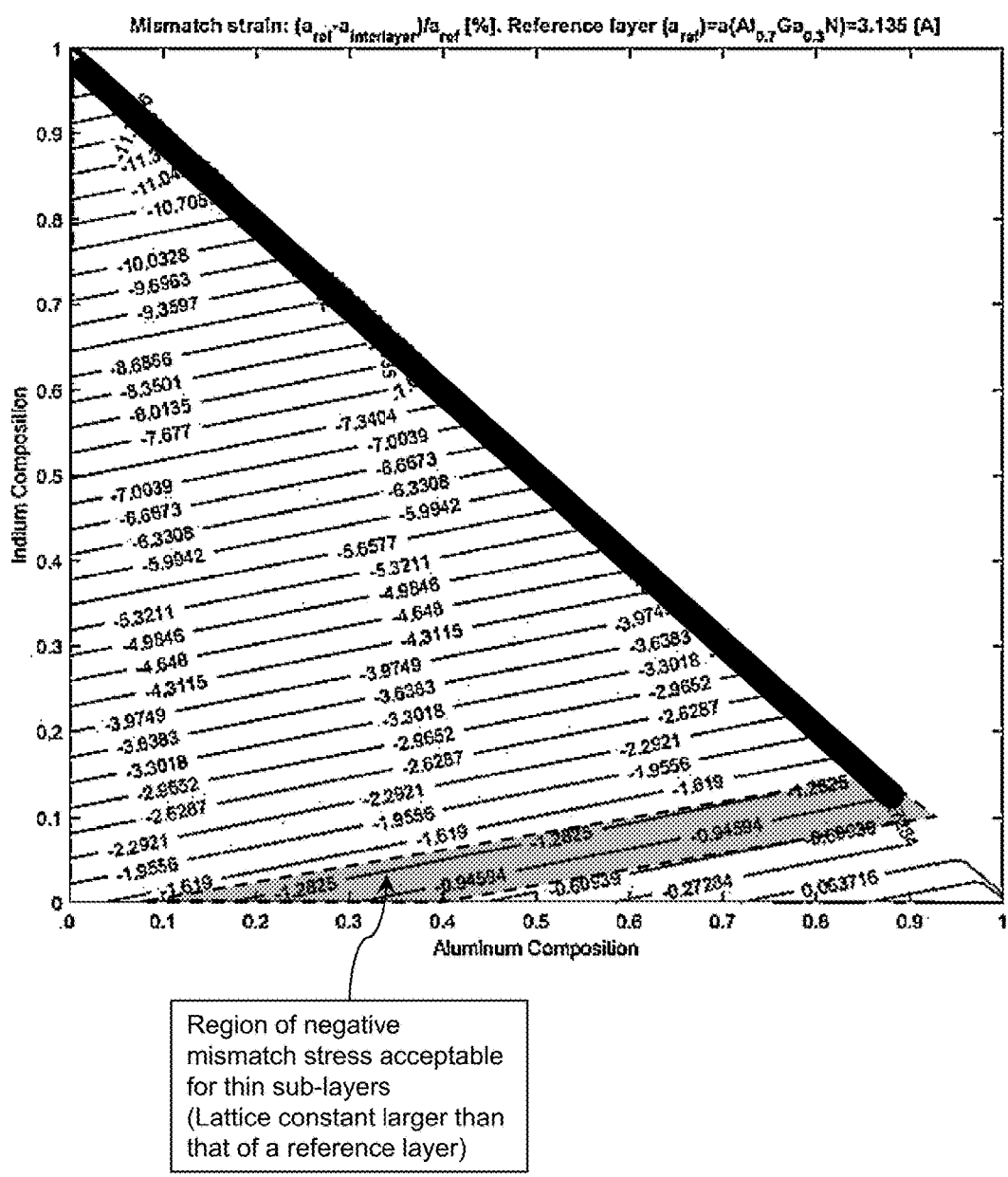

As discussed herein, inclusion of the thin sub-layer(s) in a layer formed of a different composition can induce either compression or tension within the corresponding layer. FIGS. 12A and 12B illustrate the mismatch strain for various compositions. In particular, FIG. 12A shows the mismatch strain for thin sub-layers of various molar fractions x and y of an alloy $Al_xIn_yGa_{1-x-y}N$ with the reference to a semiconductor layer comprising $Al_{0.5}Ga_{0.5}N$. For instance, domains corresponding to regions of positive and negative mismatch strain leading to induced compression and tensile strains, respectively, in the $Al_{0.5}Ga_{0.5}N$ layer are highlighted. In each case, the mismatch strain is about 1%. Similar data is illustrated in FIG. 12B, but for a reference semiconductor material being $Al_{0.7}Ga_{0.3}N$, which can be used for epitaxial growth of an electron blocking layer in ultraviolet light emitting diode.

Figure 2D:
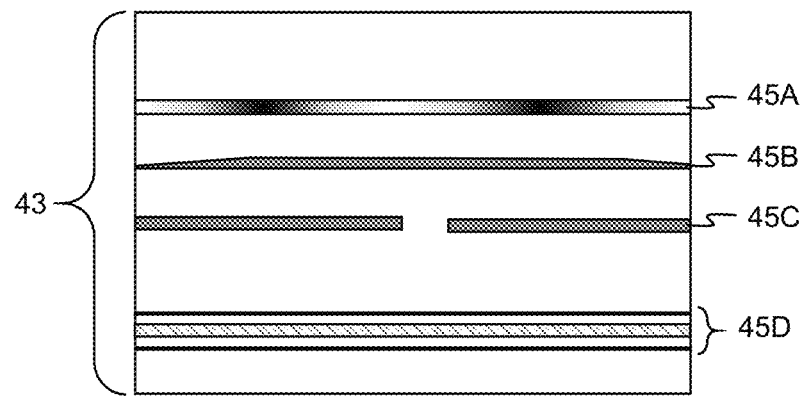
FIG. 2D shows various possible structures of thin sub-layers in a semiconductor layer according to embodiments.

In various embodiments described herein, the thin sub-layers can have a substantially uniform thickness across the lateral extent of the sub-layers. Alternatively, embodiments can include one or more thin sub-layers having a complex structure. To this extent, FIG. 2D shows various possible structures of thin sub-layers 45A-45D in a semiconductor layer 43 according to embodiments. For example, a thin sub-layer 45A can comprise a layer with laterally varying composition, which exceeds unintentional lateral variances present due to the limits of a growth process. The varying composition can be attributed to radial changes of temperature within the semiconductor substrate wafer, lateral inhomogeneities of gas flow, non-uniform diffusion, incorporation of ad-atoms over the surface, and/or the like. Such non-uniform composition can be controlled through growth parameters such as temperature, V-III ratio, chamber pressure, gas flow rate, and pulsing of gas precursors.

Figure 2E:
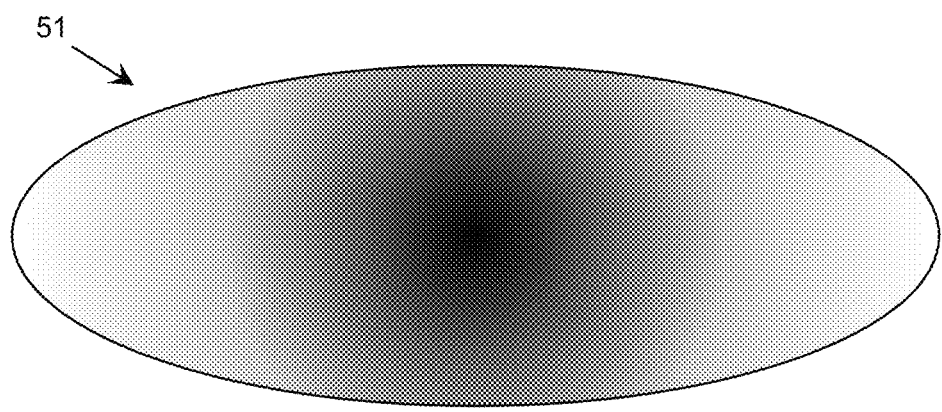
FIG. 2E illustrates how lateral variation of a temperature of a semiconductor wafer can be utilized to create lateral variation in a corresponding thin sub-layer according to an embodiment.

FIG. 2E illustrates how lateral variation of a temperature of a semiconductor wafer can be utilized to create lateral variation in a corresponding thin sub-layer 45A. In this case, the semiconductor wafer 51 can have a surface temperature that is purposefully varied to create lateral composition variations during an MOCVD growth process. In FIG. 2E, the temperature of the semiconductor wafer 51 is varied radially, resulting in radial changes in the corresponding semiconductor material (e.g. the thin sub-layer). Such lateral changes can be, for example, tailored to balance the negative edge effects related to gas flow dynamics at the edges of the surface of the semiconductor wafer 51 to result in stress control of the semiconductor material located at the edge of the semiconductor wafer 51.

Returning to FIG. 2D, a thin sub-layer 45B can have a non-uniform thickness across the lateral extent of the layer. While the thin sub-layer 45B is shown being the thickest in the middle and having a reduced thickness towards the edges, it is understood that this is only illustrative of various possible thickness variations. To this extent, in other embodiments, a thin sub-layer can include an increased thickness on the outer regions, multiple areas of increased/decreased thickness, and/or the like. Similarly, the thin sub-layer 45C is shown as a discontinuous layer. While the thin sub-layer 45C is shown being discontinuous in the middle, it is understood that this is only illustrative of various possible continuity variations. To this extent, in other embodiments, a thin sub-layer can include multiple discontinuities, a discontinuity only located on an outer region of the thin sub-layer, and/or the like. In an embodiment, at least one lateral dimension of the thin sub-layer regions is in a range of 2 nm-2 µm.

Additionally, a thin sub-layer 45D can have a vertical variation. In this case, the thin sub-layer 45D can comprise multiple, closely spaced films, each of which can be configured the same or different from other films in the thin sub-layer 45D. For example, the films can differ by one or more of thickness and/or composition. In an embodiment, each of the thin films can be separated by a layer of the surrounding material having a thickness on the order of a thickness of the films. It is understood that a semiconductor layer 45 can include any combination of one or more of the thin sub-layers 45A-45D. In an embodiment, the particular configuration of thin sub-layers 45A-45D utilized are selected based on the corresponding stresses present in the semiconductor layer 45.

Figure 3:
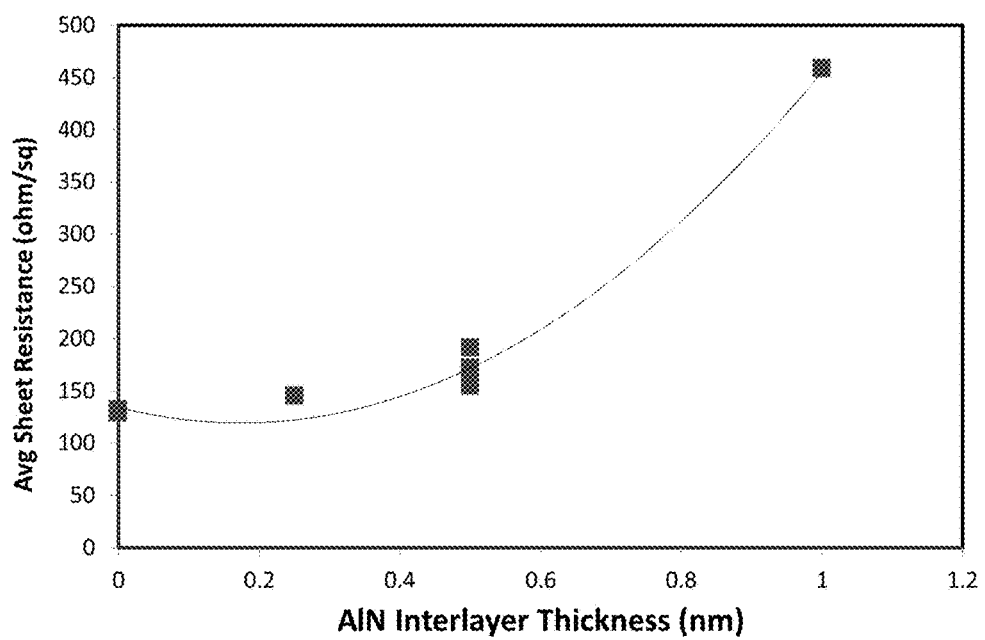
FIG. 3 shows average sheet resistance of an AlGaN layer as a function of thin AlN sub-layer thickness according to embodiments.

The inventors fabricated various heterostructures 11 with thin sub-layers 40A, 40B of different thicknesses, insertion frequencies, and periods (e.g., total number of thin sub-layers 40A, 40B), and evaluated the conductivity of the resulting $Al_{0.6}Ga_{0.4}N$ (e.g., n-type contact or AlGaN) layers 16. In each case, the thin sub-layers 40A, 40B were formed of AlN. FIG. 3 shows average sheet resistance of an AlGaN layer 16 as a function of thin AlN sub-layer 40A, 40B thickness according to embodiments. As illustrated, sub-layers 40A, 40B having thicknesses of approximately 0.5 nanometers or less do not significantly increase (e.g., the increase is less than 100 ohms/square) the average sheet resistance of the AlGaN layer 16. However, AlN sub-layers 40A, 40B having a thickness of approximately 1 nanometer cause an approximately three times increase in the sheet resistance of the AlGaN layer 16 over that of an AlGaN layer 6 without any AlN sub-layers 40A, 40B. In an embodiment, the thicknesses of the thin sub-layers 40A, 40B are selected to limit the sheet resistivity of the layer 16 to no more than fifty percent more than the sheet resistivity of a layer 6 (FIG. 2A) having the same thickness as the layer 16 and formed of the same material as the intervening sub-layers 42A, 42B, but without the thin sub-layers 40A, 40B.

In an embodiment, the thicknesses of the sub-layers 40A, 40B, 42A, 42B and the total number of thin sub-layers 40A, 40B can be selected to minimize the stresses present in the heterostructure 11 after growth. The stresses can be assessed, for example, by measuring wafer bowing at room temperature, after completion of the growth of the heterostructure 11. In an embodiment, the thicknesses of the sub-layers 40A, 40B, 42A, 42B and the total number of thin sub-layers 40A, 40B are selected to reduce an amount of wafer bowing by at least ten percent over an amount of wafer bowing that would occur in a comparable prior art heterostructure 1 (FIG. 2A).

Additionally, wafer bowing can be monitored during the growth to ensure that abrupt changes in the amount of bowing do not occur, which is indicative of the heterostructure cracking. In an embodiment, the thicknesses of the sub-layers 40A, 40B, 42A, 42B and the total number of thin sub-layers 40A, 40B are selected to maximize tensile stresses present during growth without causing the formation of cracks or strong relaxation in the heterostructure 11. An amount of tensile stress can be assessed, for example, by measuring wafer bowing during growth, and where the formation of cracks or strong relaxation is assessed by observing abrupt changes in the wafer bowing. In a further embodiment, an abrupt change to wafer bowing can be defined as a change in wafer curvature of at least fifty 1/km per ten minutes of growth time. In an embodiment, the thicknesses of the sub-layers 40A, 40B, 42A, 42B are selected to result in concave bowing of at least 100 1/km during growth of the heterostructure 11.

Figure 4:
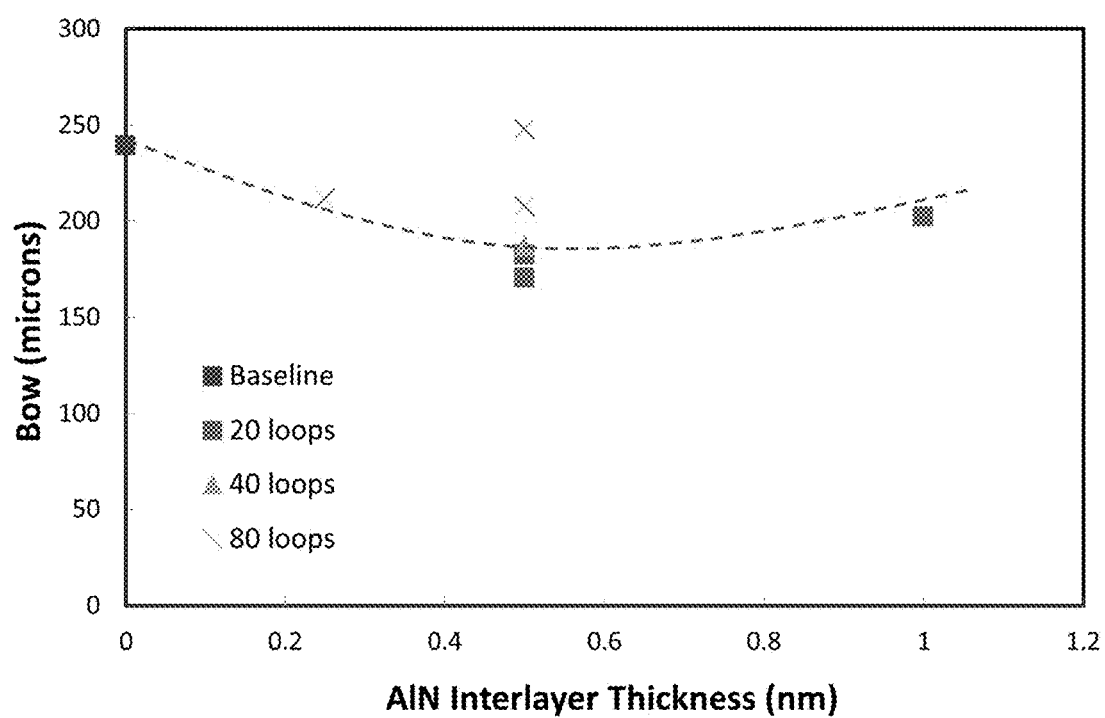
FIG. 4 shows an amount of bowing of a substrate wafer as a function of thin AlN sub-layer thickness according to embodiments.

FIG. 4 shows an amount of bowing of a substrate wafer including a heterostructure 11 as a function of thin AlN sub-layer thickness 40A, 40B according to embodiments. In this case, bowing is defined as the vertical displacement of the center of the wafer from the edges of the wafer. The inventors fabricated several versions in which the frequency of the AlN sub-layers 40A, 40B placed within the corresponding AlGaN layer 16 were varied by varying the number of periods (loops). In each case, the AlGaN layer 16 has a thickness of approximately two microns. As illustrated, an amount of bowing is minimized when the AlN sub-layers 40A, 40B have a thickness of approximately 0.5 nanometers. Furthermore, at least for a total number of sub-layers 40A, 40B exceeding twenty, a higher number of sub-layers 40A, 40B generally resulted in an increased bowing over that provided by the lower number of sub-layers 40A, 40B for an AlGaN layer 16 of the same thickness. In an embodiment, a total of twenty to forty thin sub-layers 40A, 40B are inserted for a two micron thick layer 16. In another embodiment an n-type contact layer 16 having a thickness between two to three microns includes approximately 80 thin sub-layers 40A, 40B, but no more than 120 thin sub-layers 40A, 40B.

Figure 5:
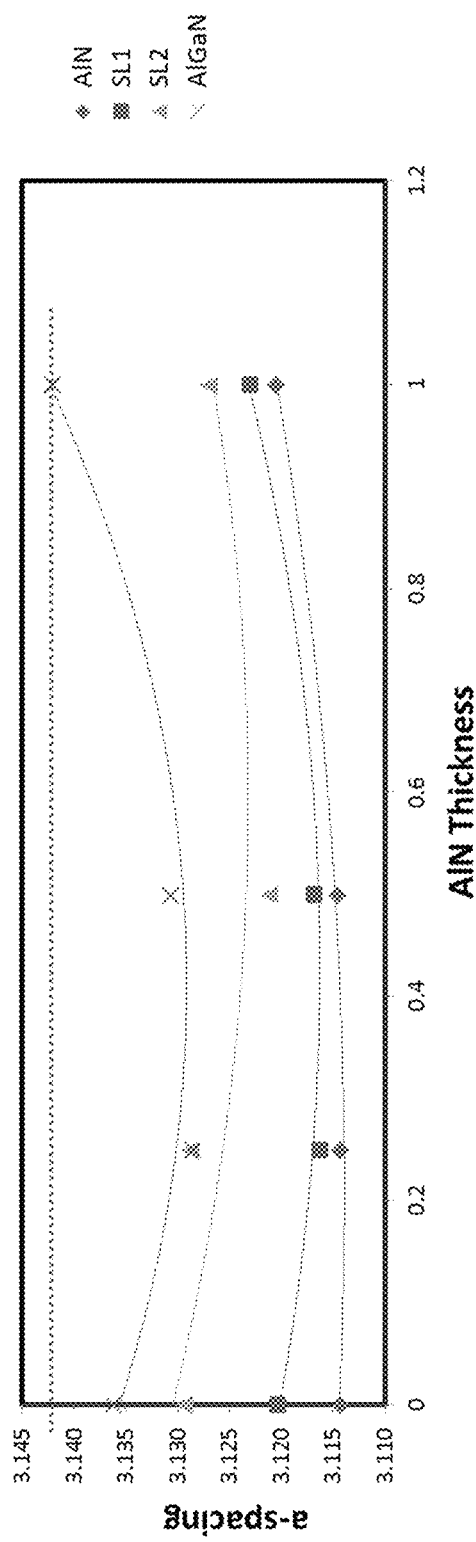
FIG. 5 shows an effect of AlN sub-layer thickness on the lattice constant a of several semiconductor layers in a heterostructure according to an embodiment.

FIG. 5 shows an effect of AlN sub-layer thickness on the lattice constant a of several semiconductor layers in a heterostructure 11 according to an embodiment. In each case, the heterostructure 11 includes an AlN buffer layer 14 and an intermediate layer 15 located between the AlN buffer layer 14 and an $Al_{0.6}Ga_{0.4}N$ layer 16. The intermediate layer 15 has first (SL1) and second (SL2) superlattices comprising pairs of $Al_{x1}Ga_{1-x1}N/Al_{y1}Ga_{1-y1}N$ layers and $Al_{x2}Ga_{1-x2}N/Al_{y2}Ga_{1-y2}N$, respectively. The horizontal dotted line corresponds to the lattice constant a for bulk $Al_{0.6}Ga_{0.4}N$. As illustrated, an AlN sub-layer thickness of approximately 0.5 nanometers corresponds to a minimum lattice constant a in the AlGaN layer, which indicates the best pseudomorphic fit and the lack of relaxation of the AlGaN material. As discussed herein, a large amount of relaxation is undesirable due to dislocation propagation and possible cracking. To this extent, the lattice constant a for the AlGaN layer being comparable to that of bulk $Al_{0.6}Ga_{0.4}N$ is indicative of relaxation having occurred.

Figure 6A:
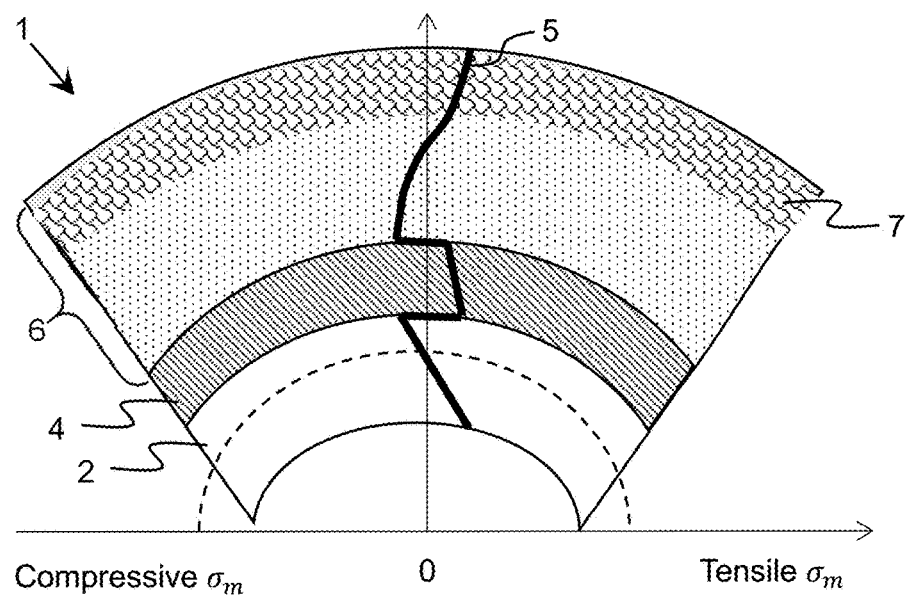
FIGS. 6A and 6B show illustrative stress diagrams for bowed wafers at room temperature according to the prior art and an embodiment, respectively.
Figure 6B:
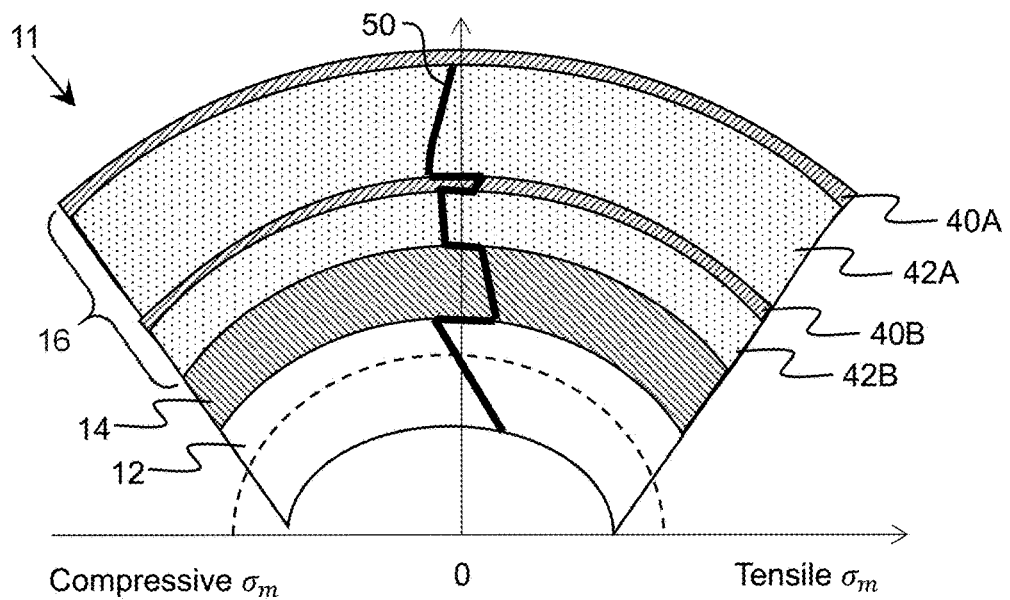

FIGS. 6A and 6B show illustrative stress diagrams for bowed wafers at room temperature according to the prior art and an embodiment, respectively. The wafers include heterostructures 1, 11 for use in fabricating an optoelectronic device according to the prior art and an embodiment, respectively. An average stress in a semiconductor layer can be computed by calculating the integral of the stress along the thickness of the layer, and such an average stress can be related to wafer bowing through Stoney's formula, for example. As illustrated, while the sign of the stresses 5, 50 change from one laminate layer to another, an overall averaged stress within a film can be deduced from the bowing of the wafer. For example, an average stress within an epitaxial semiconductor film is compressive as shown by the convex bowing. A local value of stress within the epitaxial laminate structure changes from one film layer to another discontinuously along the interface.

FIG. 6A shows a possible distribution of stresses 5 in a heterostructure 1 that does not include the thin sub-layers described herein. In this case, the relaxation process in the n-type contact layer 6 (e.g., AlGaN) can induce tensile stresses within the n-type contact layer 6. These tensile stresses can lead to the formation of micro/nano cracks and/or an increase in a number of dislocations, e.g., as indicated by region 7. These cracks and/or dislocations result in reduced device reliability. However, as shown in FIG. 6B, inclusion of the thin sub-layers 40A, 40B can avoid relaxation, which prevents tensile stresses from occurring in the n-type contact layer 16. As further shown in FIG. 6B, the thin sub-layers 40A, 40B have tensile stresses, while the intervening sub-layers 42A, 42B have compressive stresses. However, the thin sub-layers 40A, 40B do not exhibit significant relaxation and/or crack formation since they are thin (e.g., less than 2 nanometers thick).

Figure 7A:
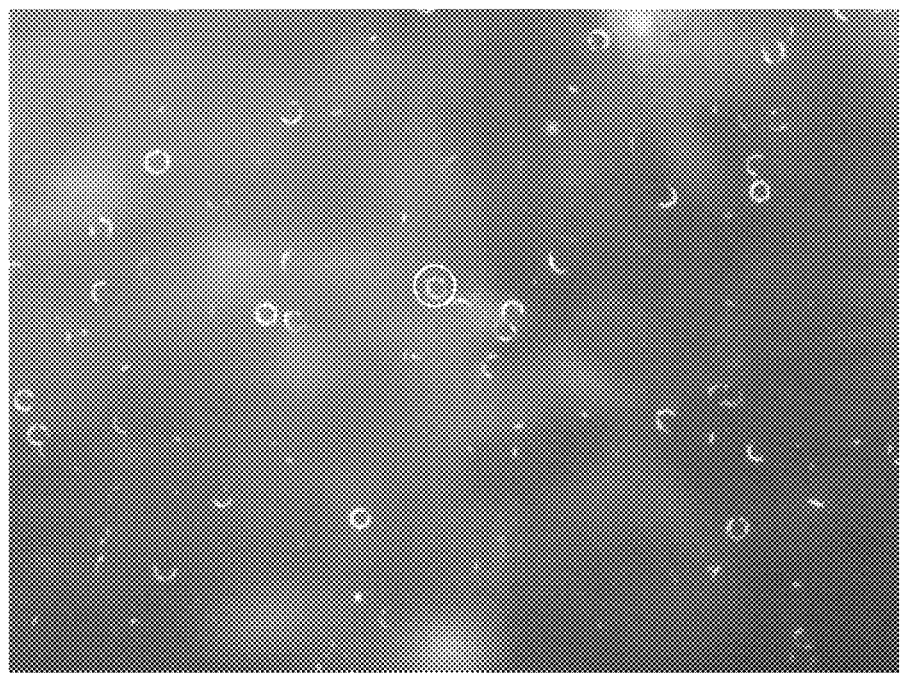
FIGS. 7A and 7B show surface morphologies resulting from growth without and with thin sub-layers described herein according to the prior art and an embodiment, respectively.
Figure 7B:
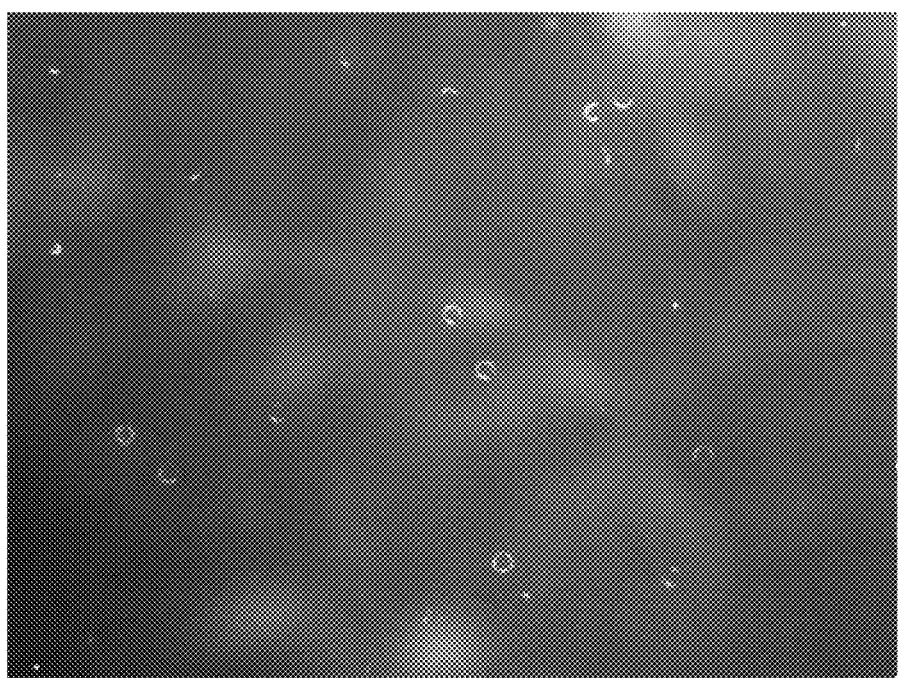

To this extent, inclusion of the thin sub-layers 40A, 40B can improve the morphology of one or more layers in the heterostructure. For example, FIGS. 7A and 7B show surface morphologies resulting from growth without and with thin sub-layers described herein according to the prior art and an embodiment, respectively. As illustrated, hexagonal defects (one of which is circled in FIG. 7A) are much more widespread in the layer grown without the thin sub-layers than in the layer grown with the thin sub-layers. In an embodiment, the thicknesses of the sub-layers 40A, 40B, 42A, 42B and the total number of thin sub-layers 40A, 40B are selected to reduce a number of defects and dislocations present in the active region 18 (FIG. 1). In a more particular embodiment, the reduction is at least an order of magnitude as compared to dislocations present at the interface between the n-type contact layer 16 and the intermediate layer 15 or buffer layer 14. In an illustrative embodiment, the heterostructure 11 is configured to use in fabricating a light emitting diode radiating at a peak wavelength in a range of 300-350 nanometers. In this case, the intervening sub-layers 42A, 42B can be group III nitride layers with an aluminum molar fraction in the range of 0.1 to 0.4 and thicknesses the range of 10 to 100 nanometers, while the thin sub-layers 40A, 40B can be, for example, AlN, and have thicknesses in the range of 0.2 to 0.8 nanometers.

Growth of an n-type contact layer 16 described herein can be performed using any solution. Additionally, it is understood that one or more attributes of the growth solution and/or n-type layer 16 can be altered during growth of the n-type layer 16. Such alteration(s) can be configured to result in an n-type layer 16 having properties that change in a vertical and/or lateral direction. In an embodiment, a growth temperature is changed for growth of the intervening sub-layers 42A, 42B and growth of the thin sub-layers 40A, 40B, e.g., to adjust a rate of growth and/or quality of the corresponding semiconductor material. For example, the respective growth temperatures can differ by at least 100 degrees Celsius. In a more particular example, the growth temperature for the intervening sub-layers 42A, 42B is at least 100 degrees Celsius higher than the growth temperature for the thin sub-layers 40A, 40B. A molar ratio between group V precursors and group III precursors (the V/III ratio) also can differ for growth of the intervening sub-layers 42A, 42B and growth of the thin sub-layers 40A, 40B, e.g., to affect the quality and/or unintentional doping of the semiconductor material. In an embodiment, the respective V/III ratios differ by at least five percent.

Additionally, one or more attributes of the n-type contact layer 16 can be changed during growth of the n-type contact layer 16. For example, in an embodiment, the thicknesses of the various sub-layers 40A, 40B, 42A, 42B can remain substantially constant throughout the n-type contact layer 16

(e.g., the thin sub-layers 40A, 40B are inserted in substantially constant intervals). Alternatively, the thicknesses of the intervening sub-layers 42A, 42B (and therefore the insertion frequency of the thin sub-layers 40A, 40B) and/or compositions of the sub-layers 40A, 40B, 42A, 42B can change throughout the n-type contact layer 16. In an embodiment, the thickness of each intervening sub-layer 42A, 42B increases in a direction away from the substrate 12, thereby causing the insertion frequency of the thin sub-layers 40A, 40B to be higher closer to the substrate 12 and lower closer to the active region 18. In a more particular embodiment, the thicknesses increase by at least five percent between adjacent intervening sub-layers 42A, 42B. Furthermore, the n-type contact layer 16 can include multiple distinct regions, each with a different configuration (e.g., insertion frequency) of thin sub-layers 40A, 40B. To this extent, the n-type contact layer 16 is shown including a region 44, which includes no thin sub-layers 40A, 40B. In an embodiment, the region 44 is fabricated from the same material, but has a larger thickness than the intervening sub-layers 42A, 42B.

In an embodiment, a composition of comparable sub-layers 40A, 40B and/or 42A, 42B changes throughout the n-type contact layer 16. In a more particular embodiment, the compositions change by at least two percent between two adjacent comparable sub-layers 40A, 40B and/or 42A, 42B. For example, an aluminum composition in the intervening sub-layers 42A, 42B can decrease in each subsequent intervening sub-layer 42A, 42B grown in a direction away from the substrate 12.

In an embodiment, a thickness of a thin sub-layer 40A, 40B varies in a lateral direction. For example, a lateral scale of the thickness fluctuation in a thin sub-layer 40A, 40B can be on the order of or smaller than a current spreading length in the n-type contact layer 16. Similarly, a thin sub-layer 40A, 40B can include compositional inhomogeneities. The varying thickness and/or composition of a thin sub-layer 40A, 40B can result in a lateral fluctuation in the band gap of the thin sub-layer 40A, 40B in a range of one to ten thermal energies.

Inclusion of the thin sub-layers described herein can be combined with one or more additional approaches to control stresses within semiconductor layers of a heterostructure. In an embodiment, the n-type contact layer 16 can be grown using a set of growth conditions configured to manipulate stresses within the heterostructure 11 in a targeted manner. For example, during growth of the n-type contact layer 16, the V/III ratio can be varied to further alter the resulting tensile and compressive stresses in a thin sub-layer 40A, 40B and/or an intervening sub-layer 42A, 42B of the n-type contact layer 16. Modification of the stresses through control of the V/III ratio can be utilized to prevent relaxation in the semiconductor layer (e.g., the n-type contact layer 16).

Figure 8:
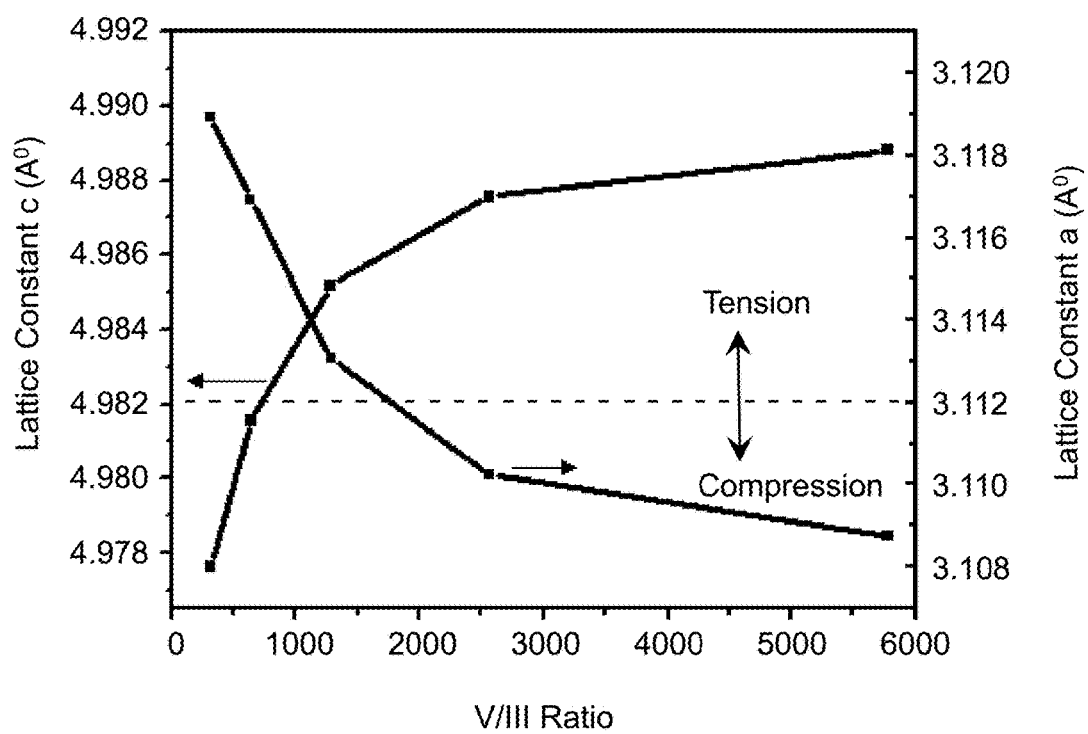
FIG. 8 shows illustrative plots of the lattice constants a and c as a function of the V/III ratio for an AlN layer according to an embodiment.

To this extent, FIG. 8 shows illustrative plots of the lattice constants a and c as a function of the V/III ratio for an AlN layer according to an embodiment. Different lattice directions can result in different tensile and compressive properties for the AlN layer. For example, for a low V/III ratio (e.g., less than approximately 1800), the lattice constant a for the AlN layer is slightly larger than the lattice constant a for an AlN layer without the presence of point defects (e.g., approximately 3.112). The difference in the lattice constant a results in tensile stresses being accumulated in the layer. For a high V/III ratio (e.g., greater than approximately 1800), the lattice constant a for the AlN layer is slightly smaller than the lattice constant a for an AlN layer without the presence of point defects, which results in compressive stresses being accumulated in the layer. The V/III ratio also influences the lattice constant c. In this case, small values of the V/III ratio (e.g., below approximately 750) result in a lattice constant c, which causes compressive stress (e.g., is below approximately 4.982) in the layer, while larger values of the V/III ratio (e.g., above approximately 750) result in a lattice constant c, which causes tensile stress in the layer.

Figure 9:
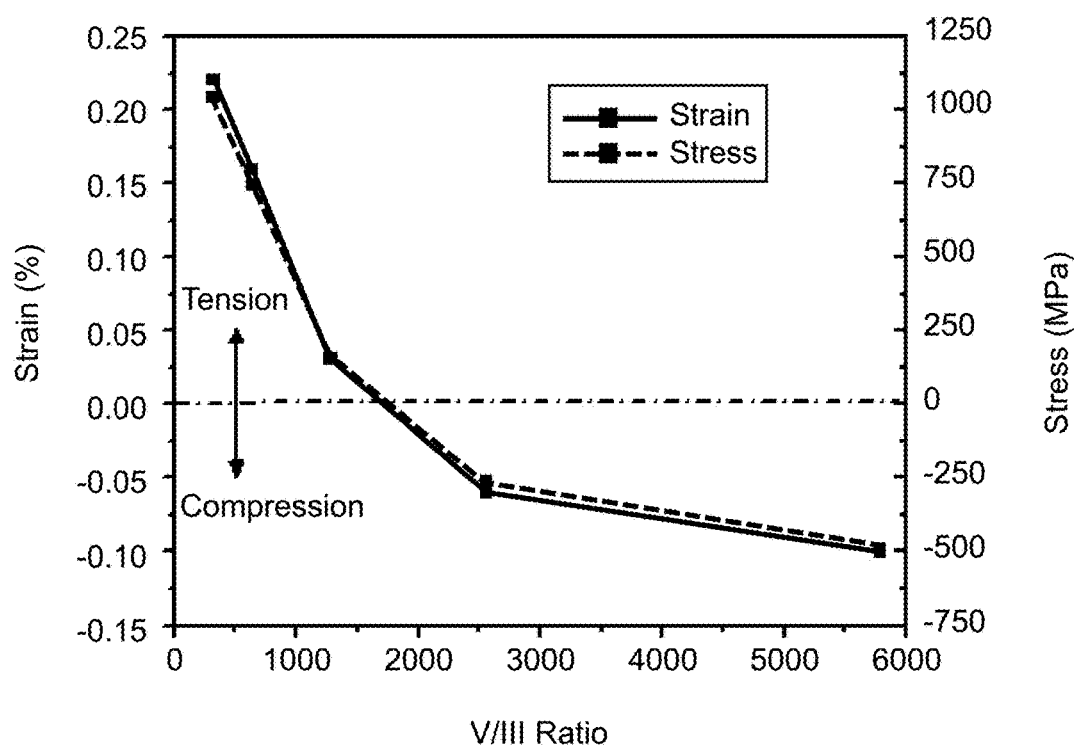
FIG. 9 shows illustrative plots of stress and strain as a function of the V/III ratio for an AlN layer epitaxially grown on a sapphire substrate according to an embodiment.

FIG. 9 shows illustrative plots of stress and strain as a function of the V/III ratio for an AlN layer epitaxially grown on a sapphire substrate according to an embodiment. As illustrated, an AlN layer grown under a low V/III ratio (e.g., less than approximately 1800) is in tensile stress, while an AlN layer grown with a high V/III ratio (e.g., above approximately 1800) is in compressive stress. As further illustrated, only small changes in the strain of the AlN layer are produced by modulating the V/III ratio. The corresponding stress in the AlN layer can be translated to the layer grown on the AlN layer (e.g., an AlGaN intervening sub-layer). In an embodiment, growth of the n-type contact layer 16 uses a set of growth parameters, which are adjusted to decrease local tensile stresses during growth. Furthermore, the set of growth parameters can be configured to limit compressive stress during growth. In an embodiment, the compressive stress is limited to approximately 1.0 GPa or less during the growth.

Furthermore, growth of another layer in a heterostructure can utilize one or more approaches configured to improve a quality of subsequently grown layers. In an embodiment, growth of a layer, such as the intermediate layer 15 (FIG. 2B), includes growth of a series of sub-layers (e.g., films) with alternating tensile and compressive stresses, which can result in dislocation reduction in subsequently grown semiconductor layers, such as the n-type contact layer 16 (FIG. 2B).

A layer can be selectively configured to have tensile or compressive stress by modulating a V/III ratio in each sub-layer. For example, the modulation can include varying the V/III ratio according to a set schedule to yield compressive and tensile sub-layers. Additionally, one or more additional deposition conditions can be changed, such as a growth temperature, a gas flow, and/or the like. Furthermore, one or more attributes of the sub-layers, such as a relative thickness of a sub-layer, a distribution of stress within each sub-layer, and/or the like, can be adjusted during the growth of the layer. The modulation of the set of deposition conditions can result in regions of increased compressive stresses and regions of increased tensile stress. In this manner, the resulting layer (e.g., the intermediate layer 15) can be configured to have a target overall residual stress (e.g., approximately zero or near zero).

Figure 10A:
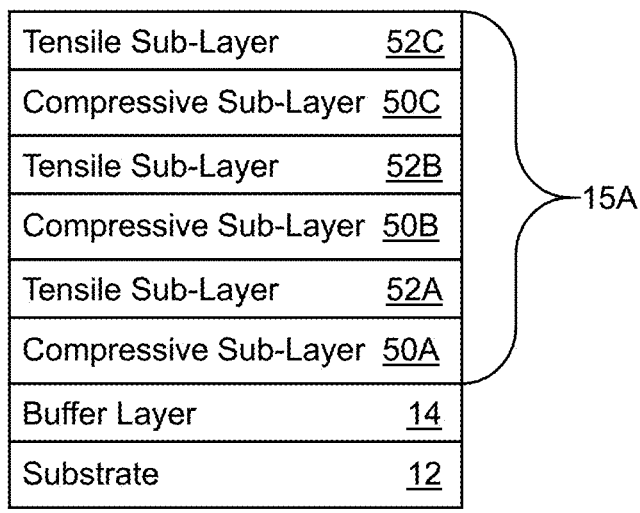
FIGS. 10A and 10B show illustrative n-type layers according to embodiments.
Figure 10B:
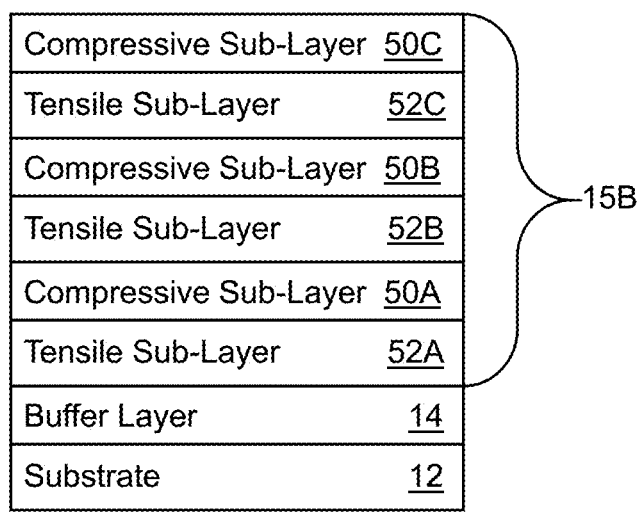

FIGS. 10A and 10B show illustrative intermediate layers 15A, 15B according to embodiments. Each intermediate layer 15A, 15B is shown grown on a buffer layer 14, which can be grown on a substrate 12. In an embodiment, the substrate 12 is a foreign substrate, such as sapphire, SiC, or the like. The buffer layer 14 (e.g., a nucleation layer) can provide a transition to accommodate a large lattice mismatch between the substrate 12 and the corresponding intermediate layer 15A, 15B. In an embodiment, the buffer layer 14 can comprise an $Al_xGa_{1-x}N/Al_yGa_{1-y}N$ superlattice, where $0 \le x$, $y \le 1$. Each superlattice layer can be, for example, up to several nanometers thick. In an embodiment, the layers with differing aluminum content (e.g., denoted by x and y) can have similar thicknesses. In an illustrative embodiment, the buffer layer 14 has a thickness in a range from nearly zero nanometers to approximately 2000 nanometers. In another embodiment, growth of the buffer layer 14 uses a growth temperature between approximately 500 and approximately 1200 degrees Celsius and a growth rate between approximately 0.01 micrometers and approximately 10 micrometers per hour.

Regardless, each intermediate layer 15A, 15B is formed of a plurality of compressive sub-layers 50A-50C alternating with a plurality of tensile sub-layers 52A-52C. In the intermediate layer 15A, a compressive sub-layer 50A is first grown, while in the intermediate layer 15B, a tensile sub-layer 52A is first grown. While each intermediate layer 15A, 15B is shown including three periods of epitaxial growth (e.g., each period including a compressive and a tensile layer), it is understood that an intermediate layer 15A, 15B can include any number of periods. In an embodiment, the stress changes abruptly between a compressive layer and the adjacent tensile layer. Alternatively, the stress can gradually change between adjacent layers (e.g., by growing layers having a graded tensile or compressive stress). Furthermore, the tensile and compressive stress can be substantially constant between periods of the intermediate layer 15A, 15B or can gradually change from period to period.

The growth of an intermediate layer 15A, 15B, and the growth of the corresponding sub-layers 50A-50C, 52A-52C forming the intermediate layer 15A, 15B, can use any set of deposition conditions. For example, the set of deposition conditions for a sub-layer 50A-50C, 52A-52C can include: a group III precursor flow rate between approximately 0.1 and approximately 200 micromoles per minute; a nitrogen precursor flow rate between approximately 100 and 10000 standard cubic centimeters per minute (SCCM); a pressure between approximately 1 and 760 Torr; a molar ratio of group V precursors to group III precursors (V/III ratio) between approximately 10 and approximately 10000; and a growth temperature between approximately 500 and approximately 1800 degrees Celsius. Furthermore, a sub-layer 50A-50C, 52A-52C can be grown to a thickness that is greater than a critical thickness to avoid pseudomorphic growth. In an embodiment, each sub-layer 50A-50C, 52A-52C has a thickness between approximately one nanometer and five micrometers.

As described herein, during the growth of an intermediate layer 15A, 15B, one or more of a set of the deposition conditions for epitaxially growing a sub-layer 50A-50C, 52A-52C can be changed to cause the resulting sub-layer 50A-50C, 52A-52C to exhibit either tensile or compressive residual stress. For example, the growth of a compressive sub-layer 50A-50C and the growth of a tensile sub-layer 52A-52C can use molar ratios of group V precursors to group III precursors that differ by at least ten percent. In an embodiment, a composition of the compressive sub-layer 50A-50C differs from a composition of the tensile sub-layer 52A-52C by no more than approximately five percent. For example, a fraction of aluminum in the tensile sub-layer 52A-52C can differ from a fraction of aluminum in the compressive sub-layer 50A-50C by no more than approximately five percent. Similarly, the compressive and tensile sub-layers can have a lattice mismatch of at least 0.0001 Angstroms. Furthermore, a growth rate for the compressive and tensile sub-layers can be changed. In an embodiment, the growth rates for the compressive and tensile sub-layers differ by at least ten percent. A growth temperature for the compressive and tensile sub-layers can be substantially the same or changed. In an embodiment, the growth temperatures for the compressive and tensile sub-layers differ by at least two percent. Still further, the number of and/or type of precursors and/or agents present during the growth of a sub-layer can be adjusted to alter elastic properties of the sub-layer. For example, precursors and agents such as: ZnO, TiN, SiN, GaAs, AlAs, GaN, InN and/or the like, can induce inhomogeneities within the sub-layer, and thus alter the elastic properties of the sub-layer.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 11:
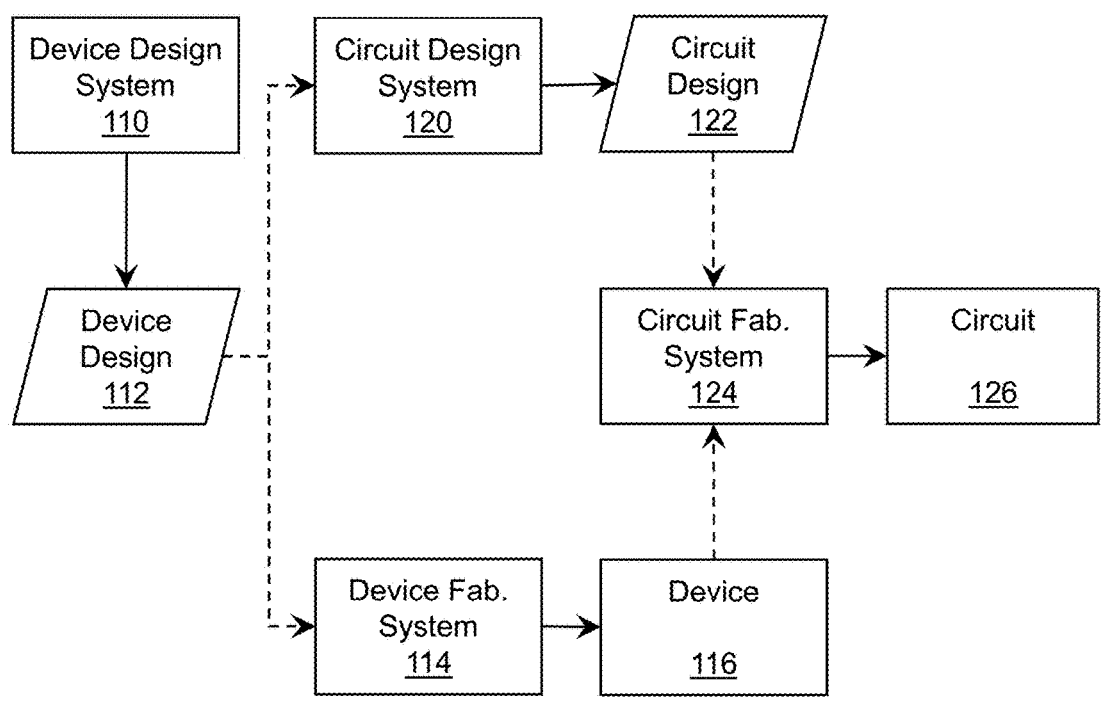
FIG. 11 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
   a n-type layer including:
      a plurality of intervening sub-layers of a first group III nitride material; and
      a plurality of thin sub-layers of a second group III nitride material, wherein the plurality of intervening sub-layers alternate with the plurality of thin sub-layers, wherein the first group III nitride material includes a molar fraction of gallium of at least 0.05, wherein a molar fraction of gallium in the first group III nitride material exceeds the molar fraction of gallium in the second group III nitride material by at least 0.05, and wherein a thickness of each thin sub-layer of the plurality of thin sub-layers is at most five percent of a thickness of each of the plurality of intervening sub-layers located immediately adjacent to each side of the each thin sub-layer of the plurality of thin sub-layers; and
   an active region adjacent to the n-type layer, wherein the active region is configured to emit electromagnetic radiation.

2. The heterostructure of claim 1, further comprising a substrate and a buffer layer located directly on the substrate, wherein the n-type layer is located on the buffer layer.

3. The heterostructure of claim 1, wherein the plurality of thin sub-layers have a higher frequency closer to the active region.

4. The heterostructure of claim 1, wherein at least one of: a composition or a thickness of a thin sub-layer in the plurality of thin sub-layers varies laterally.

5. The heterostructure of claim 1, wherein the first group III nitride material includes aluminum having an aluminum molar fraction of at least 0.1.

6. The heterostructure of claim 1, wherein the thickness of each of the plurality of intervening sub-layers is between approximately 20 nanometers and approximately 500 nanometers.

7. The heterostructure of claim 1, wherein the second group III nitride material is aluminum nitride.

8. The heterostructure of claim 1, wherein the first group III nitride material is $Al_xGa_{1-x}N$ with $0.4<x<0.7$.

9. The heterostructure of claim 1, wherein the n-type layer includes at least twenty thin sub-layers.

10. A device comprising:
    a n-type layer formed of group III nitride materials, wherein the n-type layer includes:
       a plurality of intervening sub-layers of a first group III nitride material; and
       a plurality of thin sub-layers of a second group III nitride material, wherein the plurality of intervening sub-layers alternate with the plurality of thin sub-layers, wherein the first group III nitride material includes a molar fraction of gallium of at least 0.05, wherein a molar fraction of gallium in the first group III nitride material differs from the molar fraction of gallium in the second group III nitride material by at least 0.05, and wherein a thickness of each thin sub-layer of the plurality of thin sub-layers is at most five percent of a thickness of each of the plurality of intervening sub-layers located immediately adjacent to each side of the each thin sub-layer of the plurality of thin sub-layers, wherein the n-type layer is one of: an n-type contact layer, an n-type cladding layer, or a carrier electronic layer.

11. The device of claim 10, wherein the device is configured to operate as a light emitting diode, the device further including an active region adjacent to the n-type layer, wherein the n-type layer is one of: the n-type contact layer or the n-type cladding layer.

12. The device of claim 11, wherein the plurality of intervening sub-layers have a molar fraction of aluminum within approximately twenty percent of a molar fraction of aluminum of a first barrier in the active region adjacent to the n-type layer.

13. The device of claim 10, wherein the device is configured to operate as a high electron mobility transistor, wherein the n-type layer is a carrier electronic layer.

14. The device of claim 10, wherein the thickness of each thin sub-layer of the plurality of thin sub-layers is less than a tunneling length of carriers in the n-type layer.

15. The device of claim 10, wherein the first group III nitride material is AlGaN with a molar fraction of aluminum between 0.4 and 0.7, wherein the second group III nitride material is AlN.

16. The device of claim 10, wherein at least one of: a composition or a thickness of a thin sub-layer in the plurality of thin sub-layers varies laterally.

17. A method of fabricating a device, the method comprising:
    forming a n-type layer on a substrate, wherein the n-type layer includes:
       a plurality of intervening sub-layers of a first group III nitride material; and
       a plurality of thin sub-layers of a second group III nitride material, wherein the plurality of intervening sub-layers alternate with the plurality of thin sub-layers, wherein the first group III nitride material includes a molar fraction of gallium of at least 0.05, wherein a molar fraction of gallium in the first group III nitride material exceeds the molar fraction of gallium in the second group III nitride material by at least 0.05, and wherein a thickness of each thin sub-layer of the plurality of thin sub-layers is at most five percent of a thickness of each of the plurality of intervening sub-layers located immediately adjacent to each side of the each thin sub-layer of the plurality of thin sub-layers.

18. The method of claim 17, wherein the first group III nitride material is AlGaN with a molar fraction of aluminum between 0.4 and 0.7, wherein the second group III nitride material is AlN.

19. The method of claim 17, further comprising selecting the thickness of each of the plurality of intervening sub-layers to limit a sheet resistivity of the n-type layer to no more than fifty percent more than a sheet resistivity of a comparable n-type layer formed of the first group III nitride material, having a same thickness as a thickness of the n-type layer, and including no thin sub-layers.

20. The method of claim 17, further comprising configuring the plurality of thin sub-layers to reduce an amount of wafer bowing by at least ten percent over a comparable n-type layer formed of the first group III nitride material, having a same thickness as a thickness of the n-type layer, and including no thin sub-layers.

* * * * *